US011669659B2

(12) United States Patent
Han et al.

(10) Patent No.: US 11,669,659 B2
(45) Date of Patent: Jun. 6, 2023

(54) SYSTEMS AND METHODS FOR DETERMINING MECHANICAL PROPERTIES OF MATERIALS USING SENB TESTING

(71) Applicant: Saudi Arabian Oil Company, Dhahran (SA)

(72) Inventors: Yanhui Han, Houston, TX (US); Mohammad Hamidul Haque, Katy, TX (US); Ming Fan, Blacksburg, VA (US); Younane N. Abousleiman, Norman, OK (US)

(73) Assignee: Saudi Arabian Oil Company, Dhahran (SA)

( * ) Notice: Subject to any disclaimer, the term of this patent is extended or adjusted under 35 U.S.C. 154(b) by 444 days.

(21) Appl. No.: 16/667,097

(22) Filed: Oct. 29, 2019

(65) Prior Publication Data
US 2021/0124809 A1    Apr. 29, 2021

(51) Int. Cl.
*G06F 30/23*    (2020.01)
*G06F 30/17*    (2020.01)
(Continued)

(52) U.S. Cl.
CPC .............. *G06F 30/23* (2020.01); *G01M 5/005* (2013.01); *G01N 3/40* (2013.01); *G06F 30/17* (2020.01)

(58) Field of Classification Search
CPC .......... G06F 30/23; G06F 30/17; G06F 30/25; G06F 30/367; G06F 30/398;
(Continued)

(56) References Cited

U.S. PATENT DOCUMENTS

| 2017/0154135 A1 | 6/2017 | Huang et al. |
| 2017/0370895 A1* | 12/2017 | Han .................... G01N 3/42 |
| 2018/0195982 A1 | 7/2018 | Hull et al. |

FOREIGN PATENT DOCUMENTS

| CA | 2322118 | 12/2007 |
| CN | 102221503 A * | 6/2011 |

(Continued)

OTHER PUBLICATIONS

Borovik, V.G., Chushko, V.M. and Kovalev, S.P. (1995), Computer-Aided, Single-Specimen Controlled Bending Test for Fracture-Kinetics Measurement in Ceramics. Journal of the American Ceramic Society, 78: 1305-1312. https://doi.org/10.1111/j.1151-2916.1995.tb08487.x (Year: 1995).*

(Continued)

*Primary Examiner* — Brian S Cook
(74) *Attorney, Agent, or Firm* — Fish & Richardson P.C.

(57) ABSTRACT

Systems and methods for determining mechanical properties of formation rock using, for example, millimeter-scale test samples of the formation rock are disclosed. The test samples may be single edge notched beam (SENB) test samples. The systems and methods may include performing laboratory testing on the SENB test samples and recording laboratory testing data obtained from the laboratory testing and performing a simulation on a numerical model of the SENB test samples and recording the simulation data obtained from the simulation. The laboratory testing data and the simulation data may be compared, and a determination may be made as to whether a selected degree of correlation is present between the laboratory testing data and the simulation data exists. Mechanical properties of the formation rock are obtained from the simulation data when the selected degree of correlation exists between the laboratory testing data and the simulation data.

23 Claims, 14 Drawing Sheets

(51) Int. Cl.
*G01M 5/00* (2006.01)
*G01N 3/40* (2006.01)

(58) Field of Classification Search
CPC .............. G06F 2111/00; G06F 2111/02; G06F 2111/04; G06F 2111/06; G06F 2111/08; G06F 2111/10; G06F 2111/12; G06F 2111/14; G06F 2111/16; G06F 2111/18; G06F 2111/20; G06F 2113/00; G06F 2113/02; G06F 2113/04; G06F 2113/06; G06F 2113/08; G06F 2113/10; G06F 2113/12; G06F 2113/14; G06F 2113/16; G06F 2113/18; G06F 2113/20; G06F 2113/22; G06F 2113/24; G06F 2113/26; G06F 2113/28; G06F 2115/00; G06F 2115/02; G06F 2115/04; G06F 2115/06; G06F 2115/08; G06F 2115/10; G06F 2115/12; G06F 2117/00; G06F 2117/02; G06F 2117/04; G06F 2117/06; G06F 2117/08; G06F 2117/10; G06F 2117/12; G06F 2119/00; G06F 2119/02; G06F 2119/04; G06F 2119/06; G06F 2119/08; G06F 2119/10; G06F 2119/12; G06F 2119/14; G06F 2119/16; G06F 2119/18; G06F 2119/20; G06F 2119/22; G06F 30/12; G01M 5/005; G01N 3/40; G01N 2203/0066; G01N 2203/0218; G01N 2203/027; G01N 3/20
USPC ............................................................ 703/7
See application file for complete search history.

(56) References Cited

FOREIGN PATENT DOCUMENTS

| CN | 104346498 | | 2/2015 |
|---|---|---|---|
| CN | 108751997 | A * | 7/2018 |
| CN | 209841536 | U * | 4/2019 |
| EA | 036572 | B1 * | 3/2016 |
| JP | 2003113883 | A * | 10/2001 |

OTHER PUBLICATIONS

Kucuk, Yilmaz. (2013). Modeling Nonlinear Viscoelastic Nanoindentation of PVAc at Different Unloading Rates. Strojniski Vestnik. 57. 418-422. 10.5545/sv-jme.2012.648. (Year: 2013).*
Dzugan, Jan, Konopik, Pavel, Rund, Martin. "Fracture Toughness Determination with the Use of Miniaturized Specimens". Contact and Fracture Mechanics, edited by Pranav Darji, Veera Darji, IntechOpen, 2018. 10.5772/intechopen.73093. (Year: 2018).*
Jeppe B. Jørgensen, Casper Kildegaard, Bent F. Sørensen, Design of four-point SENB specimens with stable crack growth, Engineering Fracture Mechanics, vol. 191, 2018, pp. 168-186, ISSN 0013-7944, https://doi.org/10.1016/j.engfracmech.2018.01.018. (Year: 2018).*
Mostafavi, Mahmoud & Smith, D. & Pavier, M.J.. (2010). Reduction of measured toughness due to out-of-plane constraint in ductile fracture of aluminium alloy specimens. Fatigue & Fracture of Engineering Materials & Structures. 33. 724-739. 10.1111/j.1460-2695.2010.01483.x. (Year: 2010).*
Hodges, M.K.V., Davis, L.C., and Bartholomay, R.C., 2018, Updated procedures for using drill cores and cuttings at the Lithologic Core Storage Library, Idaho National Laboratory, Idaho: U.S. Geological Survey Open-File Report 2018-1001 (DOE/ID-22244), 48 p., https://doi.org/10.3133/ofr20181001. (Year: 2018).*
Wan, J., et al. "Fracture characteristics of freestanding 8 wt% Y2O3—ZrO2 coatings by single edge notched beam and Vickers indentation tests." Materials Science and Engineering: A 581 (2013): 140-144. (Year: 2013).*
Gardan, Julien, Ali Makke, and Naman Recho. "A method to improve the fracture toughness using 3D printing by extrusion deposition." Procedia Structural Integrity 2 (2016): 144-151. (Year: 2016).*
Gan D, Gao F, Li Z, Yao X, Chen C. Energy characteristics and mechanical properties of tensile fracture of magnetite with consideration of bedding. The International Journal of Electrical Engineering & Education. 2019;0(0). doi:10.1177/0020720919837868 (Year: 2019).*
Saber Mehrabi Mazidi, Mohammad Haftani, Bahman Bohloli, Akbar Cheshomi, Measurement of uniaxial compressive strength of rocks using reconstructed cores from rock cuttings, Journal of Petroleum Science and Engineering, vols. 86-87, 2012, pp. 39-43, ISSN 0920-4105 (Year: 2012).*
Suliman_2014 (Fracture Toughness of Composite Materials, International Journal of Science and Research (IJSR) vol. 3 Issue 8, Aug. 2014). (Year: 2014).*
Inskip_2018 (Fracture Properties of Nash Point Shale as a Function of Orientation to Bedding, Journal of Geophysical Research: Solid Earth, Oct. 9, 2018) (Year: 2018).*
Abouseliman et al., "The granular and polymer composite nature of kerogen-rich shale," Acta Geotechnica, vol. 11, No. 3, Feb. 2016, 22 pages.
Cheshomi et al., "Determination of uniaxial compressive strength of microcrystalline limestone using single particles load test," Journal of Petroleum Science and Engineering, vol. 111, 2013, 6 pages.
Han et al., "Numerical and Experimental Studies of Kerogen Rich Shales on Millimeter-Scale Single-Edge Notched Beam," prepared for presentation at the 53rd US Rock Mechanics and Geomechanics Symposium in New York, Jun. 23-26, 2019, 8 pages.
Meyers et al., "Point load testing of drill cuttings from the determination of rock strength," ARMA-05-712, 40th U.S. Symposium on Rock Mechanics (USRMS), Alaska Rocks 2005, American Rock Mechanics Association, Jun. 25-29, 2005, 2 pages, ABSTRACT.
Ulboldi et al., "Rock strength measurement on cuttings as input data for optimizing drill bit selection," SPE 56441, presented at the 1999 SPE Annual Technical Conference and Exhibition in Houston, Texas, Oct. 3-6, 1999, 9 pages.
Dou et al., "Effect of joint parameters on fracturing behavior of shale in notched three-point-bending test based on discrete element model." Engineering Fracture Mechanics 205 Nov. 2019, 40-56, 17 pages.
Liu et al., "Numerical modelling of the heterogeneous rock fracture process using various test techniques." Rock mechanics and rock engineering 40.2, Jun. 2006, 107-144, 38 pages.
Pakdaman et al., "Experimental and numerical investigation into the methods of determination of mode I static fracture toughness of rocks." Theoretical and Applied Fracture Mechanics 100, Jan. 2019, 154-170, 17 pages.
PCT International Search Report and Written Opinion in International Appln. No. PCT/US/2020/057702, dated Jan. 29, 2021, 25 pages.
Tarokh et al., "Scaling of the fracture process zone in rock." International Journal of Fracture 204.2, Nov. 2016, 191-204, 14 pages.
GCC Examination Report issued in Gulf Cooperation Council Appln. No. 2020-40750, dated Dec. 5, 2021, 4 pages.

* cited by examiner

SYSTEMS AND METHODS FOR DETERMINING MECHANICAL PROPERTIES OF MATERIALS USING SENB TESTING

TECHNICAL FIELD

This present disclosure relates to determination of mechanical properties of formation rocks and, particularly, to determination of mechanical properties of kerogen-rich shales.

BACKGROUND

Mechanical properties of materials, such as rocks, metals, and concrete, are used in research, design, and analysis in many engineering and science industries. Conventionally, different mechanical properties are measured on different equipment using samples of different sizes and shapes. For example, unconfined compressive strength (UCS) can be measured using a uniaxial compression test of a cylindrical sample. Cohesive strength and frictional angle can be measured using triaxial compression of a cylindrical sample. Toughness can be measured using a single edge notched beam test (SENB). Typically, the sizes of samples used in conventional testing are inch-scale sizes.

SUMMARY

A first aspect of the present disclosure is directed to a computer implemented method for performing laboratory testing of a single edge notched beam (SENB) test sample formed from formation rock. The method includes recording laboratory testing data obtained from the laboratory testing. The method includes performing a simulation on a numerical model corresponding to the SENB test sample. The method includes recording simulation data obtained from the simulation performed on the numerical model. The method includes comparing the laboratory testing data and the simulation data. The method includes determining whether a selected level of correlation exists between the laboratory testing data and the simulation data. The method further includes obtaining mechanical properties of the formation rock when the laboratory testing data and the simulation data are within the desired level of correlation.

A second aspect of the present disclosure is directed to a non-transitory, computer-readable medium storing one or more instructions executable by a computer system to perform operations including performing laboratory testing of a single edge notched beam (SENB) test sample formed from formation rock. The medium includes recording laboratory testing data obtained from the laboratory testing. The medium includes performing a simulation on a numerical model corresponding to the SENB test sample. The medium includes recording simulation data obtained from the simulation performed on the numerical model. The medium includes comparing the laboratory testing data and the simulation data. The medium includes determining whether a selected level of correlation exists between the laboratory testing data and the simulation data. The medium further includes obtaining mechanical properties of the formation rock when the laboratory testing data and the simulation data are within the desired level of correlation.

A third aspect of the present disclosure is directed to a system including one or more processors; and a non-transitory computer-readable storage medium coupled to the one or more processors and storing programming instructions for execution by the one or more processors, the programming instructions instruct the one or more processors to perform laboratory testing of a single edge notched beam (SENB) test sample formed from formation rock. The system records laboratory testing data obtained from the laboratory testing. The system performs a simulation on a numerical model corresponding to the SENB test sample. The system records simulation data obtained from the simulation performed on the numerical model. The system compares the laboratory testing data and the simulation data. The system determines whether a selected level of correlation exists between the laboratory testing data and the simulation data. The system further obtains mechanical properties of the formation rock when the laboratory testing data and the simulation data are within the desired level of correlation.

Some embodiments of these aspects include one or more of the following features.

In some embodiments, the SENB test sample is a millimeter-scale test sample.

In some embodiments, recording laboratory testing data obtained from the laboratory testing comprises recording load and load displacement data obtained from the laboratory testing.

In some embodiments, comparing the laboratory testing data and the simulation data comprises determining whether one or more portions of the simulation data are within the selected level of correlation with one or more counterpart portions of the laboratory testing data.

In some cases, determining whether one or more portions of the simulation data are within the selected level of correlation with one or more counterpart portions of the laboratory testing data comprises determining a variance between a linear-elastic segment of a load-displacement curve generated from the simulation data and a linear-elastic segment of a load-displacement curve generated from the laboratory testing data.

In some cases, determining whether one or more portions of the simulation data are within the selected level of correlation with one or more counterpart portions of the laboratory testing data comprises determining a variance between a post-failure segment of a load-displacement curve generated from the simulation data and a post-failure segment of a load-displacement curve generated from the laboratory testing data.

In some embodiments, determining whether a selected level of correlation exists between the laboratory testing data and the simulation data comprises determining whether a difference between a portion of the simulation data and a counterpart portion of the laboratory testing data is equal to or less than a selected value or is within a selected range of values.

In some embodiments, obtaining mechanical properties of the formation rock when the laboratory testing data and the simulation data are within the desired level of correlation comprises extracting mechanical properties from the simulation data when the laboratory testing data and the simulation data are within the desired level of correlation.

In some embodiments, the programming instructions are operable to cause the one or more processors to determine whether a selected level of correlation exists between the laboratory testing data and the simulation data, and include programming instructions operable to cause the one or more processors to determine whether a difference between a portion of the simulation data and a counterpart portion of the laboratory testing data is equal to or less than a selected value or is within a selected range of values.

In some embodiments, the programming instructions are operable to cause the one or more processors to obtain mechanical properties of the formation rock when the laboratory testing data and the simulation data are within the desired level of correlation and include programming instructions operable to cause the one or more processors to extract mechanical properties from the simulation data when the laboratory testing data and the simulation data are within the desired level of correlation.

In some embodiments, the programming instructions are operable to cause the one or more processors to perform an iterative loop for a selected number of cycles or until a variation between the simulation data and the laboratory testing data are within a selected level of correlation, the iterative loop. The iterative loop includes performing a simulation on the numerical model corresponding to the SENB test sample. The iterative loop includes recording simulation data obtained from the simulation performed on the numerical model. The iterative loop includes comparing the laboratory testing data and the simulation data. The iterative loop further includes determining whether the selected level of correlation exists between the laboratory testing data and the simulation data.

The details of one or more embodiments of the present disclosure are set forth in the accompanying drawings and the description below. Other features, objects, and advantages of the present disclosure will be apparent from the description and drawings, and from the claims.

DETAILED DESCRIPTION

Figure 1:
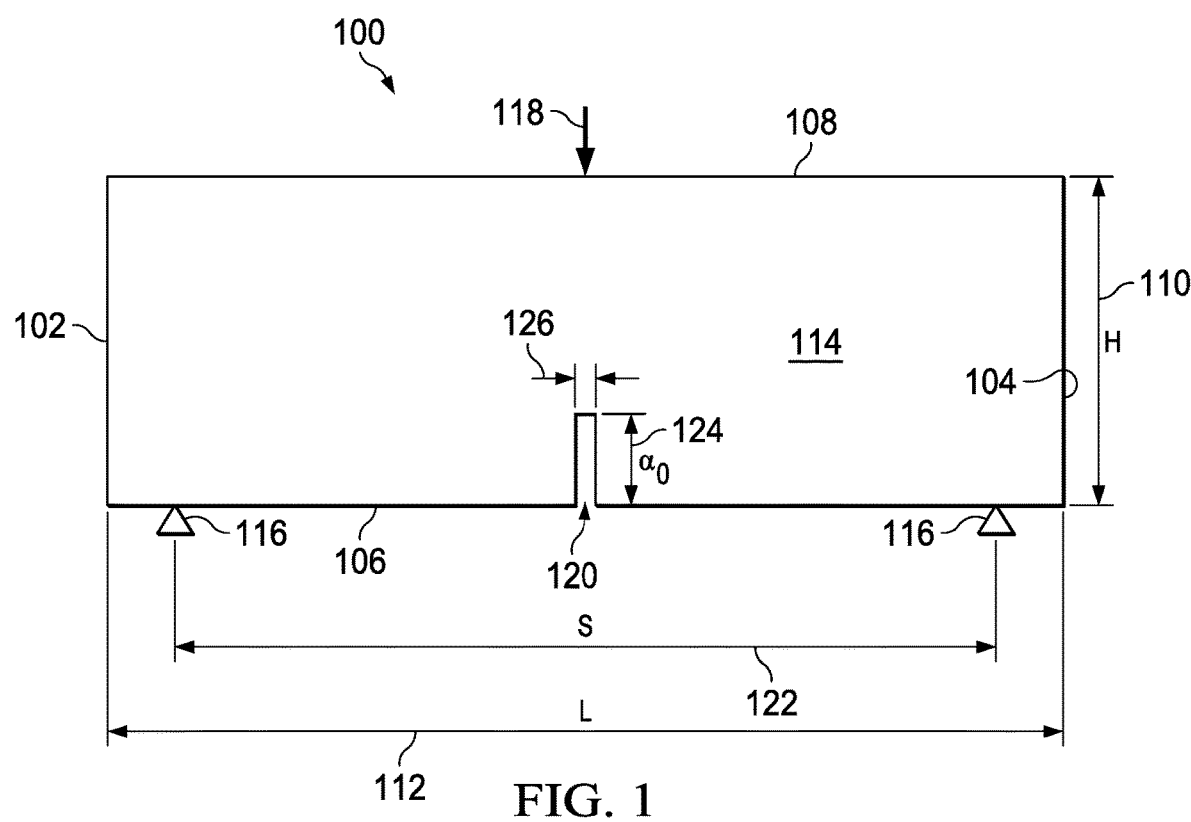
FIG. 1 is a side view of an example single edge notched beam (SENB) test sample.

For the purposes of promoting an understanding of the principles of the present disclosure, reference will now be made to the implementations illustrated in the drawings, and specific language will be used to describe the same. Nevertheless, no limitation of the scope of the disclosure is intended. Any alterations and further modifications to the described devices, systems, methods, and any further application of the principles of the present disclosure are fully contemplated as would normally occur to one skilled in the art to which the disclosure relates. In particular, it is fully contemplated that the features, components, steps, or a combination of these described with respect to one implementation may be combined with the features, components, steps, or a combination of these described with respect to other implementations of the present disclosure.

In the oil and gas industry, the determination of mechanical properties of source rock is important for engineering design in the context of, for example, drilling, well completion and stimulation, sand control, reservoir compaction, and ground subsidence computation and control. However, retrieval of rock cores from underground rock layers is costly. As a consequence, availability of rock cores is often very limited, and, in some cases, core samples are not available.

The present disclosure is directed to systems and methods for determining multiple mechanical properties from testing a single, millimeter-scale test sample. For example, millimeter-scale refers dimensions greater than 1 mm and less than or equal to 100 mm. Millimeter-scale test samples are advantageous because gravitational forces acting on the test sample are reduced when the dimensions are small. Particularly, when the test sample is of size less than or equal to 25.4 mm. Particularly, the present disclosure describes modeling methods and associated systems for obtaining mechanical properties of material using a millimeter-scale test sample and, in some instances, a single test sample. Obtaining these multiple mechanical properties would otherwise involve multiple test samples of sizes greater than those of the test sample contemplated in the present disclosure. Millimeter-scale test samples are obtainable from drill cuttings, avoiding the use of core samples. As a result, costs associated with obtaining core samples can be dramatically reduced or eliminated altogether, while providing additional mechanical properties using a single test.

The systems and methods of the present disclosure are operable to determine mechanical properties, such as Young's modulus and tensile strength of formation rock, such as shales, with the use of a single, millimeter-scale single edge notched bend (SENB) test sample. For example, mechanical properties of kerogen-rich shales (KRS) are determinable using the systems and methods of the present disclosure. Particularly, the present disclosure includes hybrid methods and associated systems to extract mechanical properties, including Young's modulus, tensile strength, and softening law, for KRS material from a single millimeter-scale SENB test. Conventionally, SENB tests are used to measure fracture toughness alone.

The present disclosure describes systems and methods for obtaining multiple mechanical properties using a single, millimeter-scale SENB test sample. The SENB test samples are millimeter-scale test samples that may be obtained, for example, from drilling cuttings as opposed to more costly core samples. For example, SENB test samples described in the context of the examples described in the present disclosure have a shape as shown in FIG. 1.

FIG. 1 is a side view of an example SENB test sample 100. The SENB test sample 100 includes a first side 102 and a second side 104 opposite the first side 102. The first and second sides 102 and 104 are parallel to each other. The SENB test sample 100 also includes a third side 106 and a fourth side 108. The third and fourth sides 106 and 108 are parallel to each other and extend perpendicularly from ends of the first and second sides 102 and 104.

The SENB test sample 100 includes a height 110 (designated as H and corresponding to a length of the first and second sides 102 and 104), a length 112 (designated as L and corresponding to a length of the third and fourth sides 106 and 108), and a width between parallel sides 114 (corresponding to a dimension that extend outwards from a surface of the drawing sheet). Also shown in FIG. 1, the SENB test sample 100 also includes support locations 116 located along side where the SENB test sample 100 is supported in a testing machine, such as on anvils of a test machine. FIG. 1 also shows a load application location 118 where a load is applied to the SENB test sample 100 by the test machine. The load application location 118 is centered over a notch 120 formed in the SENB test sample 100 between the two support locations 116, as understood in the context of FIG. 1. The distance between support locations 116 defines a span 122 (designated as S). The notch 120 is centrally located along the length 112. That is, the notch 120 is located equidistant from first and second sides 102 and 104. During testing, the notch 120 is also located equidistant from the support locations 116. The notch 120 has a depth 124 (designated as $a_0$) and a width 126.

As mentioned earlier, the SENB test sample 100 is a millimeter-scale sample. In some implementations, the length 112 of the SENB test sample may be within a range of 8.0 millimeters (mm) to 12.0 mm; the height 110 may be within a range of 3.0 mm to 4.0 mm; and the thickness may be approximately 1.0 mm. Additionally, the length 124 of the notch 120 may be approximately 1.0 mm. The width 126 of the notch 120 may be within a range of 100 micrometers (μm) to 200 μm. The ratio of the width 126 of the notch 120 to the test sample height (H) 110 is preferably within the range 0.01 to 0.07. Typically, the width 126 of the notch 120 can be within the range 40-200 micrometers. The ratio of length 124 of the notch 120 to the width 126 of the notch 120 is important and is preferably within the range 0.2 to 0.6.

These dimensions are provided merely as examples in order to provide illustration of the example systems and methods of the present disclosure. Other SENB test samples having other dimensions are within the scope of the present disclosure. Further, the SENB test samples presented in the context of the described examples are prepared and tested in accordance with ASTM standard ASTM E399-12. However, in other implementations, other testing standards may be used.

For the purposes of explanation, the present disclosure describes several examples involving test samples formed from KRS. The kerogen-rich shales include bedding layers and kerogen deposits. However, the scope of the present disclosure is not limited to KRS. As such, other types of materials are within the scope of the present disclosure. For example this technology can be applied to measure mechanical properties of most, if not all, materials that demonstrate elasto-plastic mechanical behaviors, such as shale, carbonate, sandstones, polymers such as thermoplastics, thermoset, rubber, polymer matrix composites with particulate like fillers such as nanoclay, chopped fibers, carbon black, or fiber or nanofiber like fillers such as carbon nanotubes, Boron nitride nanotubes, ceramics matrix composites, and metal-ceramics matrix composites.

Figure 2:
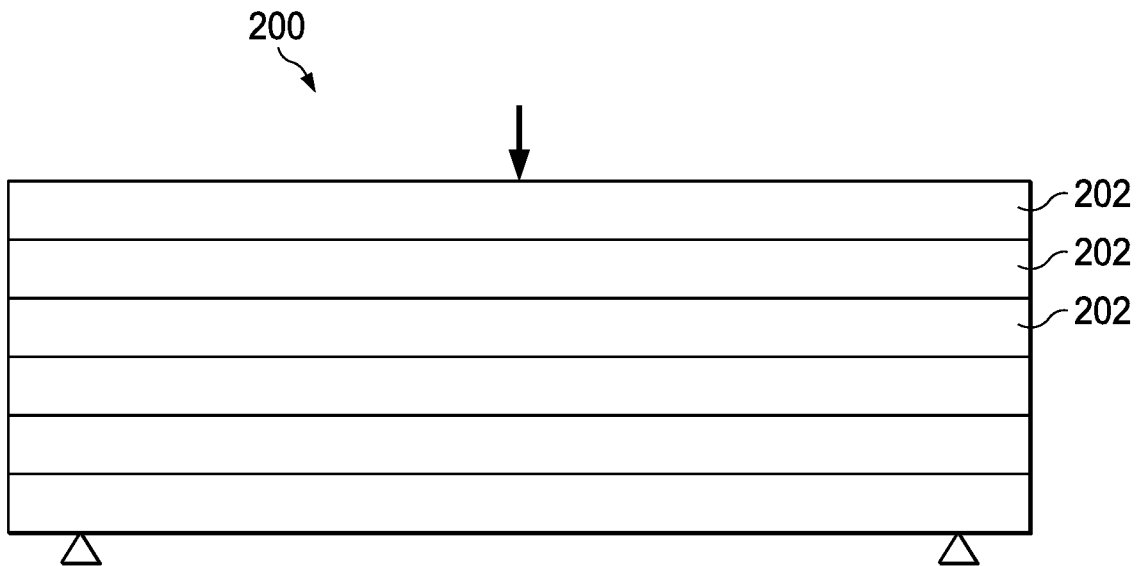
FIG. 2 is a side view of another example SENB test sample in which bedding layers are oriented perpendicularly to a loading direction.
Figure 3:
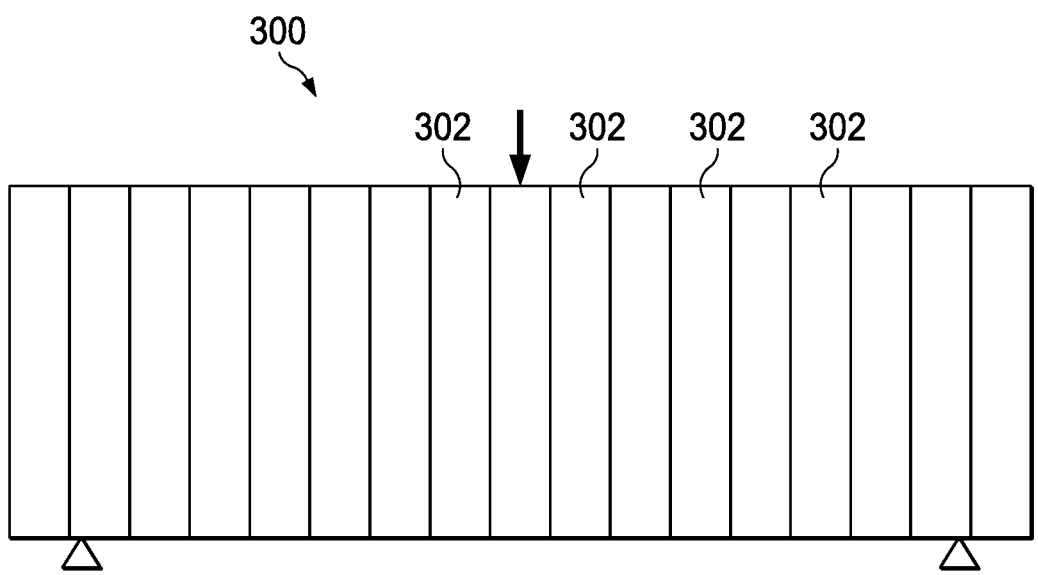
FIG. 3 is a side view of another example SENB test sample in which bedding layers are oriented in parallel with a loading direction.

Orientations of the bedding layers of the KRS used in the example SENB test samples may be varied relative to a loading direction. For example, FIG. 2 shows a sample 200 in which bedding layers 202 are oriented perpendicularly to a loading direction 204. FIG. 3 shows a sample 300 in which bedding layers 302 are parallel to a loading direction 304. Table 1 shows the dimensions of six samples: three having bedding layers oriented perpendicularly to a loading direction, and three samples having bedding layers oriented parallel to a loading direction. The samples H1, H2, and H3 denote samples having bedding layers oriented in a horizontal direction, and the samples V1, V2, and V3, denote samples having bedding layers oriented in a vertical direction.

Referring again to FIG. 1, in some implementations, the SENB test sample 100 may be cut to size using a diamond saw blade. Sides 114 of the SENB test sample 200 may be polished to ensure that the sides 114 are parallel to each other. The notch 120 may be formed using a diamond saw blade. In some implementations, a width 126 of the notch 120 may correspond to a thickness of the diamond saw blade. For millimeter-sized miniature beams, prepared from natural materials, the width of notch is often limited by and depends on the precision of the cutting tools and accuracy of the cutting operation.

TABLE 1

Dimensions of SENB Test Samples

| | length, L (mm) | height, H (mm) | thickness, t (mm) | span, S (mm) | notch length, $a_0$ (mm) |
|---|---|---|---|---|---|
| H1 | 9.46 | 3.00 | 1.00 | 8.00 | 1.04 |
| H2 | 11.92 | 3.36 | 1.02 | 8.00 | 1.02 |
| H3 | 9.58 | 3.34 | 0.93 | 8.00 | 0.80 |
| V1 | 8.24 | 3.20 | 0.99 | 7.00 | 1.10 |
| V2 | 8.30 | 3.12 | 1.00 | 7.00 | 1.07 |
| V3 | 8.24 | 3.06 | 0.99 | 7.00 | 1.04 |

The descriptors at the tops of the columns in Table 1 correspond to the following dimensions identified in FIG. 1. The length, L, corresponds to the length 112; the height, H, corresponds to the height 110; the span, S, corresponds to the span 122; and the notch length, $a_0$, corresponds to the notch length 124. The thickness, t, is the dimension of the samples extending between sides 114 of the SENB test samples.

The SENB test samples are tested individually. The SENB test samples are installed into a test machine, such as an Instron 5966 loading frame produced by the Instron of 825 University Ave, Norwood, Mass. 02062-2643, and the test machine is used to perform physical testing.

With reference to FIG. 1, the SENB test sample 100 is loaded into the test machine. Particularly, the SENB test sample 100 may be loaded into a three-point bending fixture of the test machine, such that supports or anvils of the test machine engage the SENB test sample 100 at the support locations 116. The span 122 between the support locations 116 may be adjusted by altering a position of the anvils of the test machine. For example, the anvils of the test machine may be moved inwards towards each other or outwards away from each other to reduce the span 122 or increase the span 122, respectively.

The load applied by the test machine is applied at the load application location 118 via a movable loading anvil. The loading anvil may be movable in a direction of arrow 118 that is perpendicular to fourth side 108. The rate at which the loading anvil is moved in the direction of arrow 118 may be varied. It is desirable to have a reduced loading speed, because a reduced rate of movement of the loading anvil (and, thereby, to load the SENB sample at a reduced rate) promotes a quasi-static process. That is, at a reduced loading speed, kinetic effects are reduced or eliminated, and, as a consequence, the loading process is quasi-static. In some implementations, the loading speed may be within a range of 0.01 millimeters per minute (mm/min.) to 0.10 mm/min. In other implementations, the loading speed may be within a range of 0.03 mm/min. to 0.06 mm/min.

During testing of an SENB test sample, the load applied by the loading anvil of the testing machine and the loading speed are measured and recorded. In some implementations, the measured data may be recorded by a data acquisition system. The data acquisition system may form part of the test machine or may be separate from the test machine. The data acquisition system may be or include a computer, as described in more detail later.

Additionally, during testing, a camera is used to capture images of the SENB test sample. The camera may be operable to capture images of the testing in rapid succession. For example, in some implementations, the camera may be a Phantom V611 camera produced by Vision Research, Inc., of 100 Dey Road, Wayne, N.J., 07470. The camera may have an image-recording rate of 6000 frames per second (fps) up to 1,000,000 fps. Other image recording rates may be used. The camera operates to capture the instances when a crack that originates at the notch formed in the SENB test sample and successive images as the crack propagates through the SENB test sample. Thus, image-recording rates other than those described earlier may be used such that initiation and propagation of the crack is captured with sufficient chronological resolution to capture the rapidly changing nature of the crack. The camera captures images of the crack with sufficient resolution and frequency to enable measurement of the length of the crack and a size of the crack mouth opening as the crack propagates from the notch formed in the SENB test piece. Because the crack tends to propagate quickly, the camera captures images of the SENB test piece in rapid succession.

Figure 4:
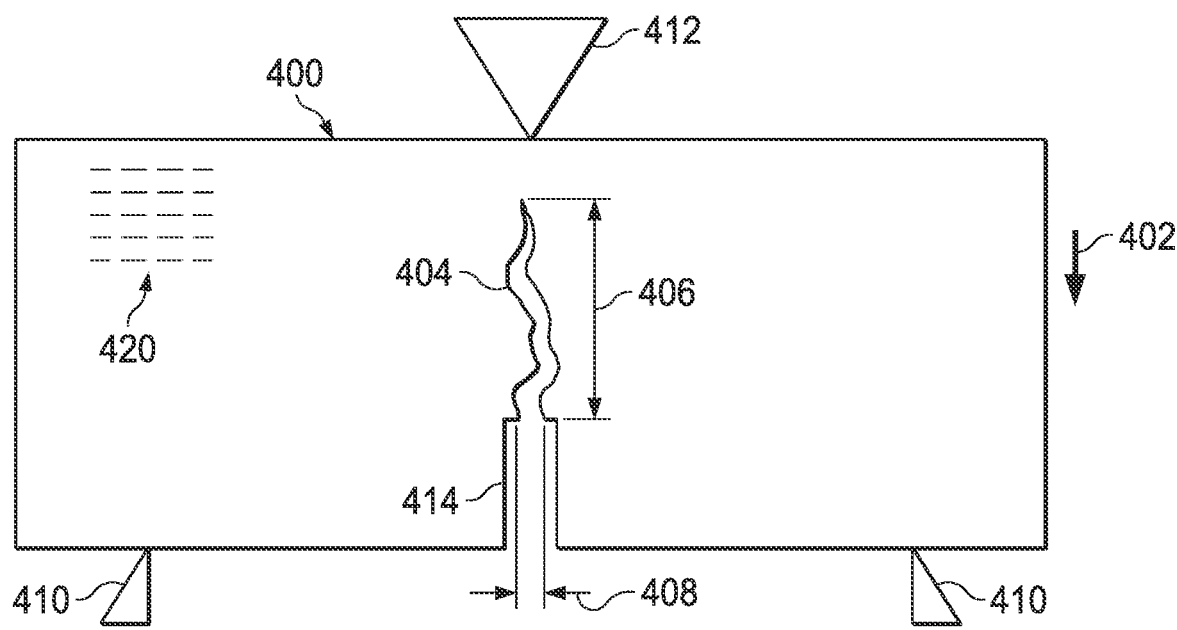
FIG. 4 is a side view of an example SENB test sample in which bedding layers are oriented perpendicularly to a loading direction and in which a crack has propagated from a notch formed in the SENB test sample.
Figure 5:
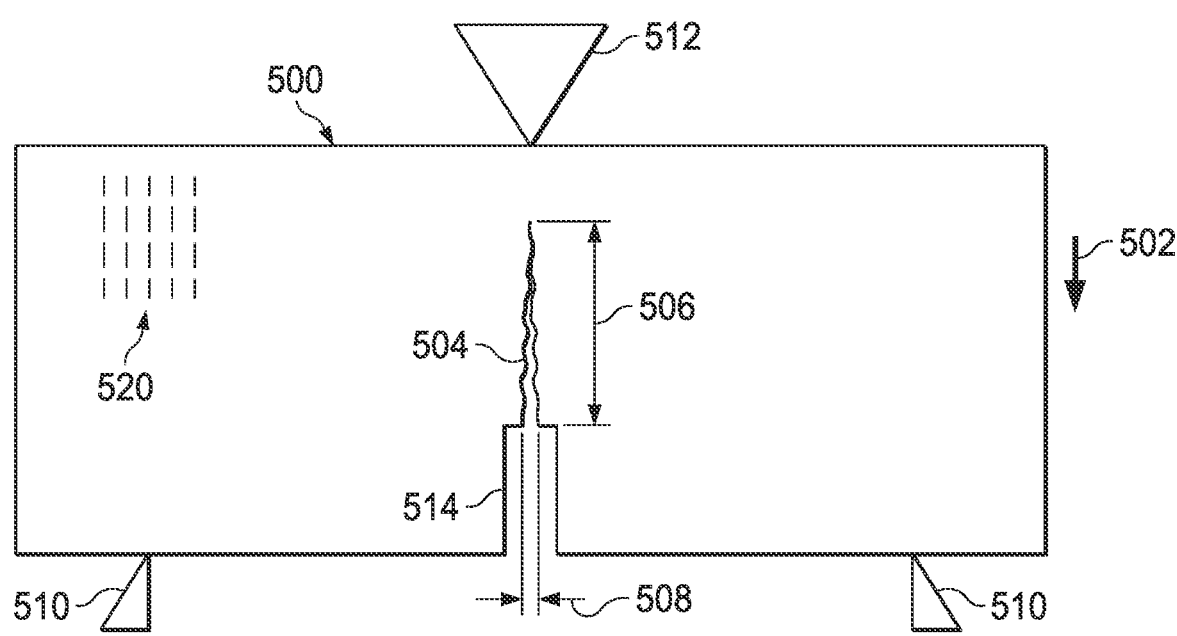
FIG. 5 is a side view of another example SENB test sample in which bedding layers are oriented in parallel with the loading direction and in which a crack has propagated from a notch formed in the test sample.

FIGS. 4 and 5 are example images of SENB test pieces obtained using the camera. FIG. 4 shows a first SENB test sample 400 in which bedding layers are oriented perpendicularly to the loading direction 402. A key 420 illustrates alignment of the bedding layers relative to the loading direction 402. FIG. 5 shows a second SENB test sample 500 in which bedding layers are oriented in parallel with a loading direction 502. A key 520 illustrates alignment of the bedding layers relative to the loading direction 502. FIGS. 4 and 5 show instantaneous cracks 404 and 504 having lengths 406 and 506, respectively, and crack mouth openings 408 and 508, respectively, at an instant that the images of the SENB test samples 400 and 500 were captured.

The size of the crack length and crack mouth opening size are measured and recorded. In some implementations, these data may be recorded in a data acquisition system. In some implementations, the data acquisition system may be the same data acquisition system used to measure the data for the applied load and loading anvil displacement described earlier. In other implementations, the data acquisition system may be different form the data acquisition system used to store the loading data and loading anvil displacement data.

The images captured by the camera, such as the images shown in FIGS. 4 and 5, are of such a quality in chronological resolution and image resolution that the crack lengths and crack mouth opening sizes are determinable. As a result, the crack length size and crack opening size are capable of being measured and stored throughout all or a portion of a test applied to the SENB test sample. In some implementations, sizes of the crack length and crack mouth opening for an image captured by the camera may be determined using image processing software. The image processing software may be resident on the camera, resident on the data acquisition system, located remotely, or a in a combination of these locations.

In some implementations, the instances at which the camera captures images of the SENB test sample may be synchronized with a sampling rate at which the loading magnitude and loading anvil displacement measurements are taken. With these data sets synchronized, the crack length size and the crack mouth opening size may be correlated with the magnitude of the load applied to the SENB test sample and the displacement of the loading anvil of the test machine. Crack length can be used in the model buildup and not used when processing simulation results. The crack mouth opening size is not always required but can be used to validate or correlate numerical simulation results to laboratory test data. These correlated data are utilized to generate a model, and that model is used to obtain simulation results to correspond with the laboratory experiments using the SENB test samples. The generated models and simulations are discussed in more detail later.

Referring again to FIG. 4, the SENB test sample 400 may be similar to the SENB test sample 100 described earlier and is located in a three-point bending fixture such that supporting anvils 410 and a loading anvil 412 engage the SENB test sample 400. The crack 404 initiates at and extends from a notch 414 formed in the SENB test sample 400. As displacement of the loading anvil 412 occurs, the crack 404 propagates along a tortuous path as a result of the orientation of the bedding layers being perpendicular to the loading direction 402.

Referring to FIG. 5, the SENB test sample 500 may be similar to the SENB test sample 100 described earlier and is located in a three-point bending fixture such that supporting anvils 510 and a loading anvil 512 engage the SENB test sample 500. The crack 504 initiates at and extends from a notch 514 formed in the SENB test sample 500. As displacement of the loading anvil 512 occurs, the crack 504 propagates along a less tortuous or more linear path, as compared to the crack 404 of the SENB test sample 400, as a result of the orientation of the bedding layers being parallel to the loading direction 502.

Figure 6:
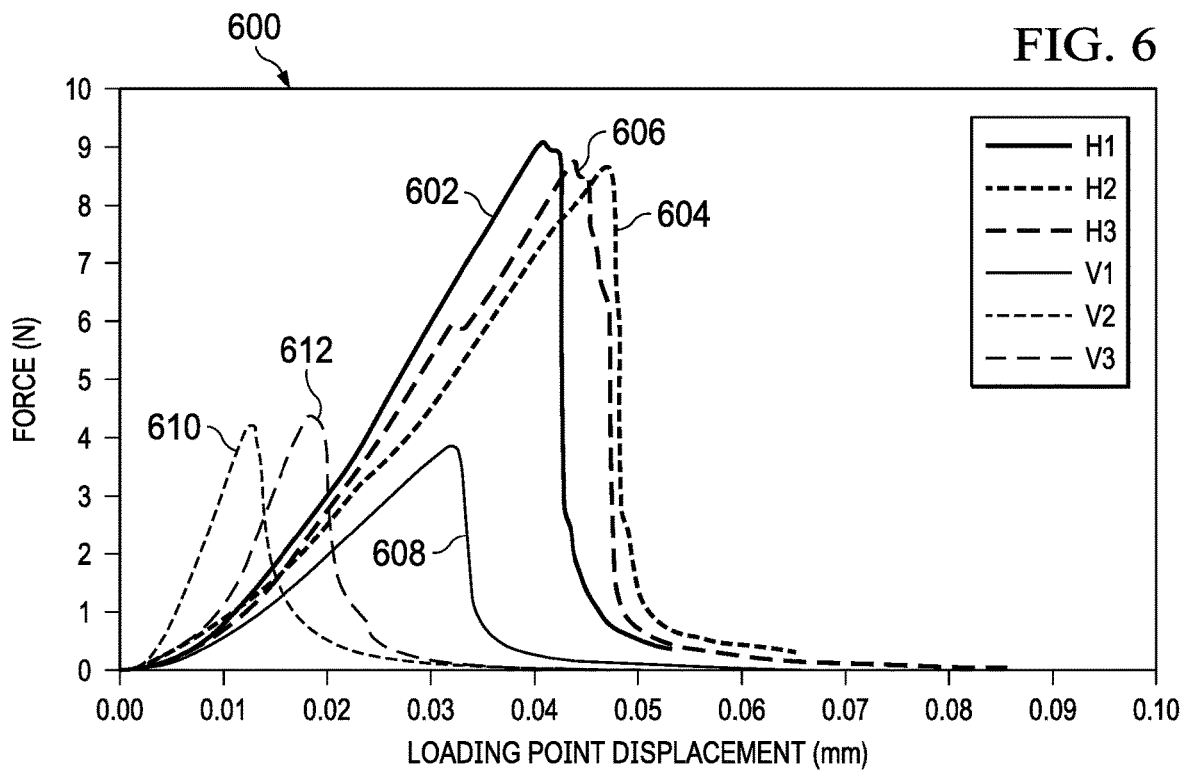
FIG. 6 is an example chart that includes load versus loading point displacement laboratory experiment data for several SENB test samples.

FIG. 6 is a chart 600 that includes load versus loading point displacement laboratory experiment data for each of the SENB test samples listed in Table 1. Graphs 602, 604, and 606 correspond to the experiment data for SENB test samples H1, H2, and H3, respectively. Graphs 608, 610, and 612 correspond to the experiment data for SENB test samples V1, V2, and V3, respectively.

Figure 7:
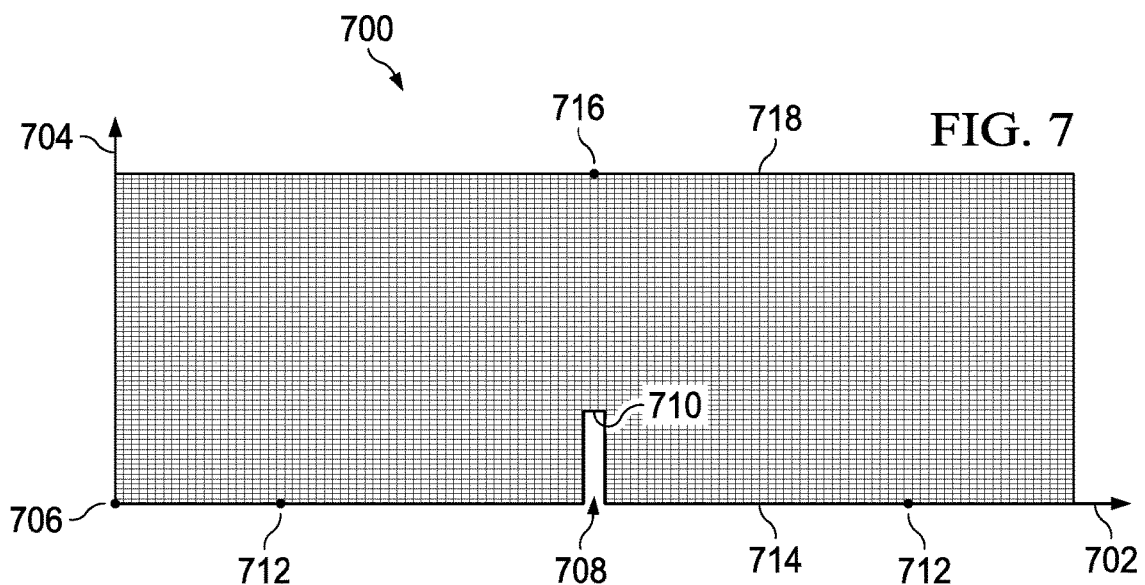
FIG. 7 is an example numerical model of an SENB test sample.

A numerical model of the SENB test sample for a corresponding actual SENB test sample subject to laboratory testing is created. As described in the present application, laboratory testing is intended to describe actual physical testing on a test sample to obtain experiment data. The location at which the physical testing occurs is not significant. Creation of a numerical model includes generating a computation mesh, assigning mechanical properties, defining an initial stress field, and defining boundary conditions. FIG. 7 is an example numerical model 700 of an example SENB test sample that corresponds to the SENB test sample H2 described earlier. The described methodology by which a numerical model is created and utilized is intended to be illustrative in nature and is not intended to represent a limitation on the scope of the present disclosure. Rather, the scope of the disclosure is intended to encompass test samples having different sizes and shapes, different mesh sizes (such as mesh sizes and distributions to uniformly cover a numerical model of a test sample), different initial stress states (such as an initial stress free state), different boundary conditions, mechanical properties, stress-strain relationships, as well as other properties and characteristics. Thus, the scope of the disclosure is intended to encompass test samples and associated numerical models as would be appreciated by one skilled in the art.

The numerical model 700 includes a 120 element by 68 element computational mesh. The 120 element by 68 element (also referred to as "120×68") computation mesh includes 120 elements along the x-axis 702 and 68 elements along the y-axis 704. The x-axis 702 and the y-axis 704 define a coordinate system having an origin 706. Although an origin 706 is located at a corner of the numerical model 700, the origin 706 may be located at another location in the numerical model 700. In this example, the computational mesh includes 120 columns arranged along the x-axis 702 and 68 rows arranged along the y-axis 704. It is noted that a computation mesh of different sizes may be used, and the 120×68 mesh is used merely as an example. Grid points of the computation mesh may be adjusted such that the computational mesh is uniformly distributed over the model. Thus, in the context of sample H2, the grid points of the computational mesh may be adjusted such that the computational mesh is formed of uniform elements that uniformly cover the model having a length of 11.92 millimeters (mm) and a height of 3.36 mm. A portion of two columns of elements, particularly columns 60 and 61, in the center of the computational model 700 are removed so as to form a notch 708. The portion of columns 60 and 61 are removed up to a height of 1.0 mm to form the notch 708. The y-coordinates of grid-points that form a ridge 710 of the notch 708 may be uniformly adjusted so that the ridge 710 of the notch 708 is located at 1.02 mm. Y-coordinates for an end surface 712 of the numerical model 700 may be located at 3.36 mm.

Boundary conditions for the numerical model 700 are defined to correspond to the conditions experienced by the H2 sample. Particularly, locations for the support anvil and loading anvil are defined. The support anvil locations are identified at points 712. Similar to the H2 sample, the points 712 are disposed along a wall 714, are symmetrically arranged on the numerical model 700 relative to a horizontal center of the numerical model 700, and are separated by a span of 8.00 mm. Thus, each of the points 712 is offset from the notch 708 by an equal amount such that the distance between the locations along the x-axis 702 is 8.00 mm. The points 712 are defined as being fixed in the vertical and horizontal directions.

The point 716 of the loading anvil is centrally located along a side 718 of the numerical model 700 above the notch 708, as understood in the context of FIG. 7. The point 716 is defined to be moveable in the vertical direction but fixed in the horizontal direction (for example, a roller boundary condition). The vertical movement permitted by the point 716 of the loading anvil simulates the applied loading by the loading anvil.

In the present example, the loading applied at point 716 is defined to be applied vertically towards the numerical model 700 at a constant rate to simulate the loading applied to the H2 sample. As in the laboratory testing of the H2 sample, the load is defined to be applied at a constant velocity at the point 716 on the side 718 of the numerical model 700 of the SENB test sample. In the laboratory testing, the rate at which the load is applied is selected to minimize the kinetic effects, resulting in quasi-static loading process. In the numerical simulation, a similar loading rate is selected. The loading velocity is selected to ensure a quasi-static loading process. However, where the loading velocity is selected to be less than that needed to establish a quasi-static process, computational time for performing the simulation increases. Therefore, in order to reduce computational time while maintaining a quasi-static loading process, different loading velocities were tested. As a result of these tests, it was discovered that simulation results did not change if the loading velocity is at or less than $10^{-10}$ meters per step (m/step). As a result, a loading velocity of $10^{-10}$ m/step is used in the numerical simulation of the numerical model 700. Various types of simulations may be used. For example, simulation types within the scope of the present disclosure include a finite element method, a finite volume method, or a discrete element method. Others methods are also within the scope of the disclosure.

A material is defined by properties associated with the material. Thus, as material properties are assigned to a numerical model, a type of material assigned to the numerical model may also be defined. Example properties applied to a numerical model include a stress-strain relationship and density. A stress-strain relationship is defined using several mechanical properties. Particularly, defining a stress-strain relationship involves assigning two elastic properties (particularly, a Young's modulus and a Poisson's ratio) and three plastic parameters (particularly, cohesive strength, internal frictional angle, and tensile strength (also referred to as ultimate tensile strength or UTS)). It is noted that, in the present example, the dilation angle is assumed to be zero. As a result, dilatant behavior is anticipated to be nonexistent. In other implementations, a dilation angle may be a non-zero value. Initial values of Young's modulus and Poisson's ratio are selected by a user and applied to the numerical model.

Density is another material property defined for the numerical model. Generally, density does not affect the mechanical response of a numerical model as long the density is not unreasonable. In this example, a value of 2000 kilograms per cubic meter ($kg/m^3$) is used. However, in other instances, other density values may be used.

Returning to numerical model 700, an initial stress-strain relationship applied the numerical model 700 is an elastic perfectly-plastic constitutive law based on an initial assumption that the KRS material forming the H2 sample follows this type of stress-strain relationship. However, it is noted that, in other instances, other types of stress-strain relationships may be applied. Because an iterative approach is contemplated with respect to numerical testing of the numerical model 700, the stress-strain relationship (and potentially other properties assigned to the numerical model 700) may be varied in different simulations. Thus, if the results of a simulation do not conform to the laboratory test results of a test sample, one or more properties of the numerical model 700, such as the stress-strain relationship, may be altered and a new simulation performed.

The values of elastic and plastic mechanical properties of a material being tested, such as KRS in the present example, are determined by matching simulation results with laboratory test data. Thus, laboratory test results of a test sample, such as an SENB test sample, and simulation test results of a numerical model that represents the test sample are compared. If the test results do not compare favorably, the numerical model is modified, and a new simulation is performed.

In this way, mechanical properties of the test sample is computed through comparing and matching the force-displacement curves of numerical models and laboratory measurements. The matching may be optimized using a mathematical fitting routine (such as least squares fit) or by eye which is often good enough since the variation of the computed mechanical properties can be small. This process can be done iteratively to converge to a more accurate solution. This iterative approach may be repeated any number of times until a desired level of correlation between the laboratory test results and the numerical model test results is achieved. A desired level of correlation may be a preselected level defined by a user. Consequently, the present disclosure provides implementations in which the mechanical properties of a material undergoing testing are determined by comparing a force-displacement curve obtained from a simulation with a force-displacement curve obtained during laboratory testing of a physical test sample.

Generally, elastic properties dominate the mechanical response of a material within an elastic deformation stage. The elastic deformation state is represented by a linear elastic response segment of a force-displacement curve. The linear-elastic response segment is the segment of a force-displacement curve preceding an instant where the load reaches a peak value. On the other hand, plastic properties control the peak loading capacity and post-failure segment of the force-displacement curve.

In the example of numerical model 700, a Poisson's ratio, $\upsilon$, of 0.35 is used. However, as mentioned earlier, other values for Poisson's ratio may be used for an initial simulation or at one or more subsequent simulations. The Young's modulus is determined by matching the linear-elastic response segment of a force-displacement curve of a simulation test and the linear-elastic response segment of a force-displacement curve of a laboratory test.

In determining Young's modulus, an initial value for Young's modulus is applied to the numerical model along with other properties, initial stress field, and boundary conditions, among others, as explained earlier. A simulation is run on the numerical model, and, as a result, a load-displacement curve associated with the numerical model is produced. The linear-elastic response segment of the load-displacement curve produced by the simulation is compared to the linear-elastic response segment of the load-displacement curve produced during laboratory testing. If the two curves do not have a desired level of correlation, the Young's modulus applied to the numerical model is altered, and a new simulation is performed. For example, if the slope of the linear-elastic segment is less than that of the slope of the linear-elastic segment of the experimentally-determined load-displacement curve, a value for the Young's modulus is increased, and a new simulation is run on the numerical model. It is noted that other properties of the numerical model may also be altered between simulations. The linear-elastic response segment of a new load-displacement curve associated with the new simulation is once again compared to the linear-elastic response segment of the load-displacement curve associated with the laboratory tests. If a desired correlation is not produced, the Young's modulus of the numerical model is again altered; a new simulation is run; and the linear-elastic response segments are again compared. This process may be iteratively performed until a desired level of correlation is achieved.

In some implementations, if a slope of the linear-elastic response segment of the simulation is less than a slope of the linear-elastic response segment of the load-displacement curve from the laboratory test, a value for the Young's modulus may be increased, and a new simulation is run. If the slope of the linear-elastic response segment of the simulation is greater than the slope of the linear-elastic response segment of the load-displacement curve from the laboratory test, a value for the Young's modulus may be decreased, and a new simulation is run.

Figure 8:
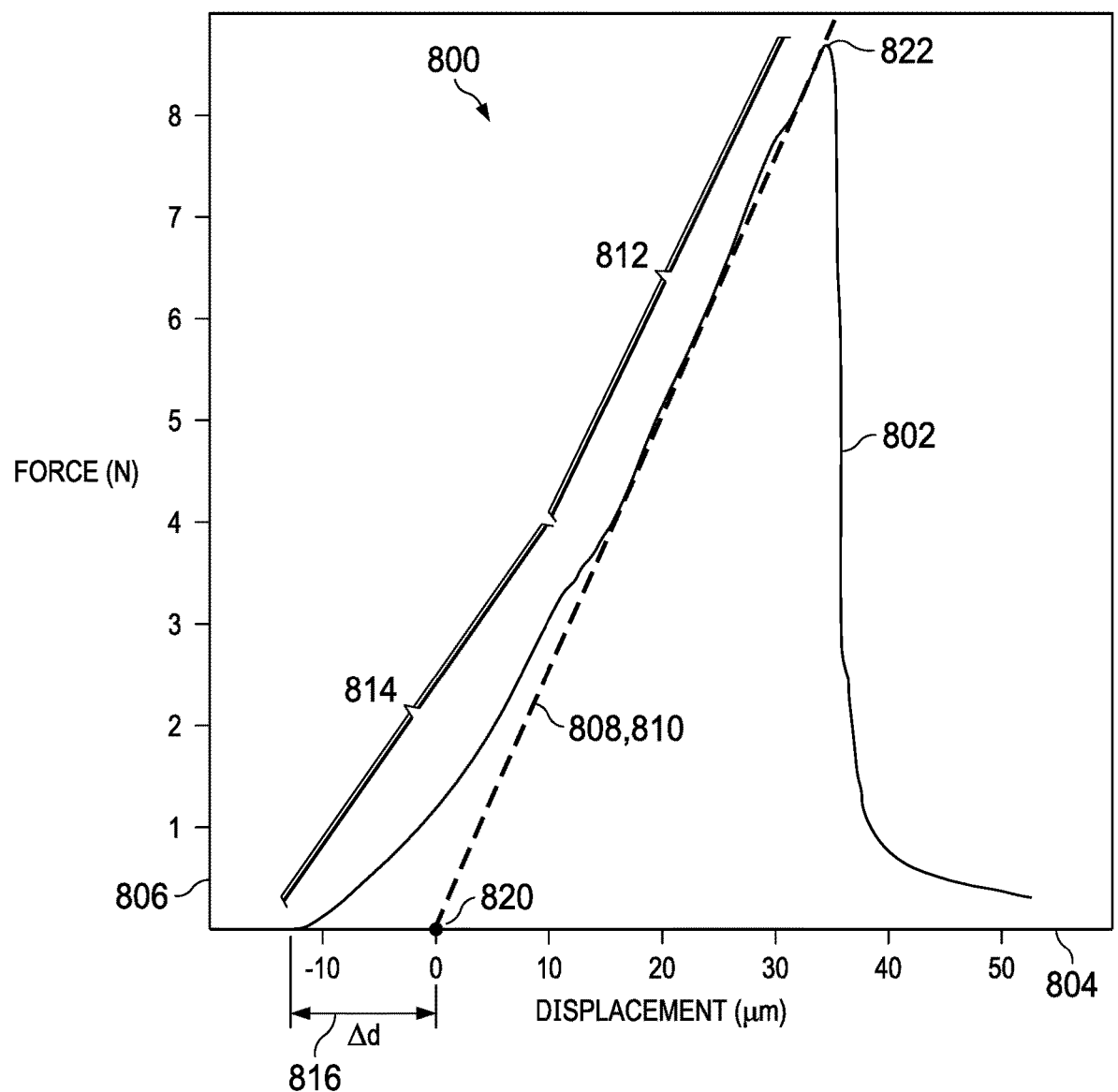
FIGS. 8-15 are example charts that show load-displacement curves of different SENB test samples obtained through laboratory testing along with load-displacement curves obtained from simulation of numerical models of the respective SENB test samples.

FIG. 8 is a chart 800 that shows a load-displacement curve 802 of SENB test sample H2 obtained through laboratory testing. The x-axis 804 represents displacement of a loading anvil applied to the SENB test sample, whether applied to a physical sample or a numerical model. In the illustrated example of FIG. 8, the displacement is measured in micrometers ($\mu$m). The y-axis 806 represents a force applied to the SENB test sample, measured in newtons (N). The chart 800 also includes linear-elastic response segment 808 of a load-displacement curve 810 obtained via a simulation performed on the numerical model corresponding to SENB test sample H2. In this example, a simulation using a finite volume method is used. The linear-elastic response segment 808 has a desired or preselected degree of correlation with a linear-elastic response segment 812 of the load-displacement curve 802. The load-displacement curve 802 also includes a non-linear response segment 814. The non-linear response segment 814 forms part of an initial portion of the load-displacement curve 802 and may be caused by closure of microcracks commonly existing in heterogeneous materials, such as KRS. In some implementations, linear-elastic response segments may be determined to have a desired level of correlation where a variance between the two linear-elastic segments is equal to or less than a desired amount of variance. For example, a desired level of correlation may exist where a variation between a slope of a portion of one graph and a slope of a portion of another graph is within a selected level of variance or is less than or equal to a selected variance. Further, in some implementations, the two linear-elastic response segments, one from laboratory testing and one from simulation testing, may be determined to have a desired level of correlation when a portion of each curve has the desired level of correlation. For example, as shown in FIG. 8, the linear-elastic response segments 808 and 812 are determined to have a desired level of correlation.

Because the non-linear segment 814 of the load-displacement curve 802 is not used in the context of comparing the linear-elastic response segments 808 and 812 to determine Young's modulus of a test sample, the load-displacement curve 802 is shifted along the x-axis 804 by a distance 816, identified as $\Delta$d, such that a line tangent to the linear-elastic response segment 812 intersects the origin point 820. In the example shown in FIG. 8, the load-displacement curve 802 of SENB test sample H2 is shifted to the left as represented by the drawing sheet (or, stated another way, in the negative direction of the x-axis 804) by 12.4 Using the described method of determining Young's modulus, the determined Young's modulus, E, of the SENB test sample H2 is 2.4 gigapascals (GPa).

The loading capacity or peak load that may be experienced by an SENB test sample before yielding occurs is controlled by plastic mechanical properties of a material forming the SENB test sample. As a result of the symmetry of the SENB test sample geometry (as illustrated in FIGS. 1 and 7, for example) and the symmetry of boundary conditions applied to the SENB test samples (as also shown in FIGS. 1 and 7 regarding the locations of the loading anvil and support anvils relative to the SENB test sample geometry), the SENB test samples fail in tensile crack mode, and the peak load is determined by and, thus, related to the ultimate tensile strength (UTS). Consequently, the peak load is used to determine the UTS of the material forming the SENB test sample. For an SENB test sample loaded in simple bending, UTS is determinable using the bending equation σ=My/I, the peak load 822 obtained from the load-displacement curve 802, and the geometry of the SENB testing sample according to know principles. Using this approach, the UTS of the SENB test sample H2 is determined to be 36.5 megapascals (MPa).

Figure 9:
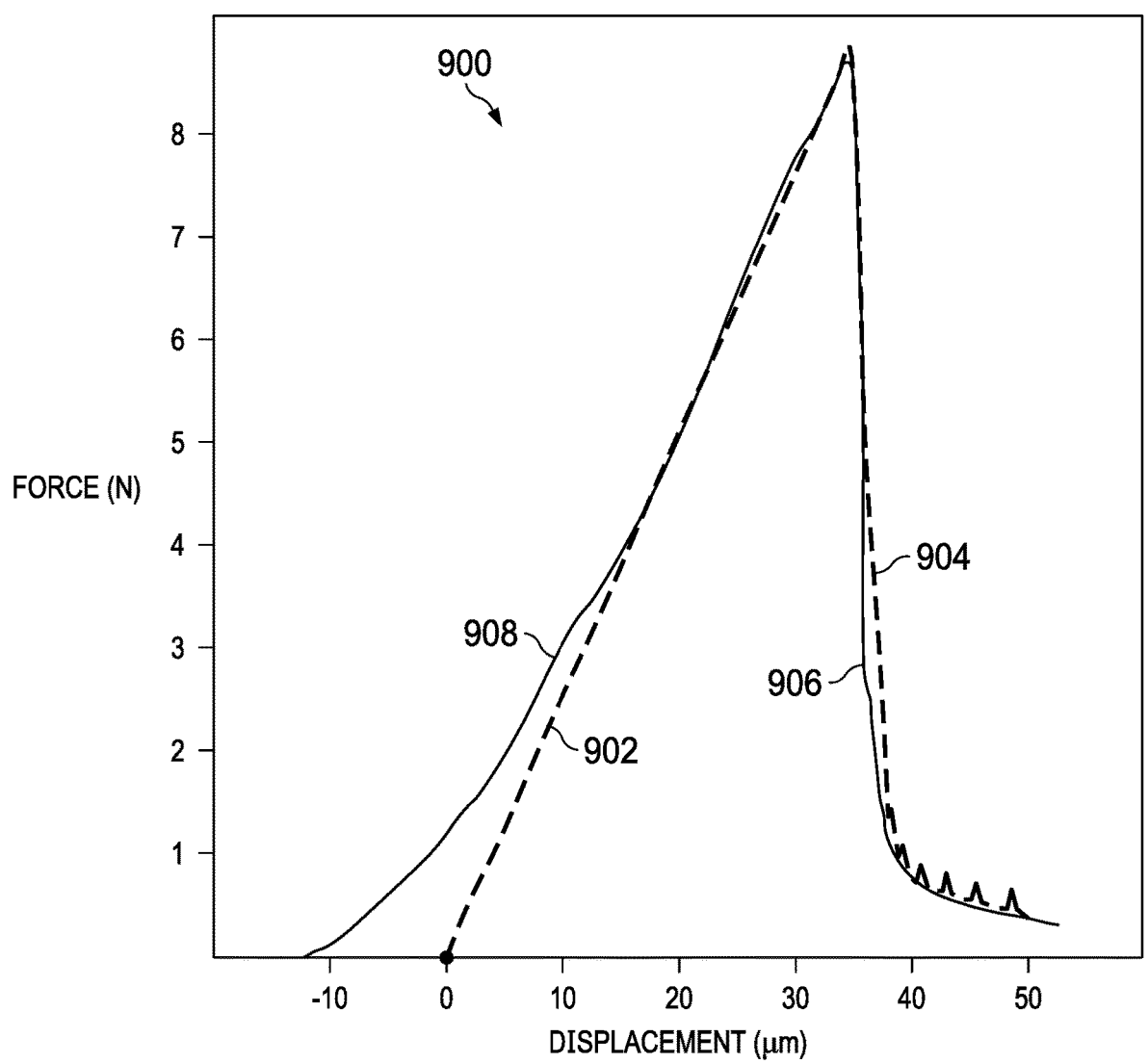

The UTS is used as an input into the numerical model and can be determined iteratively as discussed previously. A simulation performed on the numerical model uses the UTS to determine a decreasing or post-failure segment of a load-displacement curve, as shown, for example, in FIG. 9. FIG. 9 is a chart 900 that also presents test data associated with the SENB test sample H2. The chart 900 of FIG. 9 is identical to the chart 800 of FIG. 8 except that the load-displacement curve 902 obtained from simulation results of the numerical model for SENB test sample H2 includes a decreasing or post-failure segment 904. Similar to the linear-displacement response segment 808, the post-failure segment 904 is also determined using an iterative approach.

A material response, such as Mohr-Coulomb model or a strain-softening model, is applied to a numerical model. Other types of material responses also may be used and are within the scope of the present disclosure. For example, a strain-hardening model, Drucker-Prager model, Modified Lade model, Hoek-Brown model, Cam-Clay model, Double-yield model, and Ubiquitous Joint model may also be used and are within the scope of the present disclosure. However, the scope is not so limited. There are many constitutive models for geological materials, including Mohr-Coulomb, Hoek-Brown, Cam-Clay, Drucker-Prager, and modified Lade. In still other implementations, other types of material response models may be used and are within the scope of the present disclosure. This material response defines how the material represented in a numerical model behaves during yielding. Returning to FIG. 9, the numerical model for the SENB test sample H2 is defined to have a Mohr-Coulomb model with brittle tensile strength with a UTS of 36.5 MPa. With these properties of the numerical model for the SENB test sample H2 defined, a simulation of the numerical model is performed and the resulting load-displacement curve 902 is produced.

As shown in FIG. 9, the post-failure segment 904 of the load-displacement curve 902 conforms to the post-failure segment 906 of the load-displacement curve 908 of the laboratory testing of the physical SENB test sample H2. In the illustrated example, the post-failure segment 904 and the post-failure segment 906 have a desired level of correlation. If the post-failure segments 904 and 906 do not have a desired level of correlation, then the material response of the numerical model may be modified; a new simulation of the numerical model may be performed; and a new comparison between the post-failure segment of the laboratory test results and the generated post-failure segment of newly generated load-displacement curve obtained from the simulation may be performed. This process may be iteratively conducted until a desired level of correlation is obtained.

As a result of the described iterative approach, Young's modulus, Poisson's ratio, and UTS are determined for a material using an SENB test sample of a millimeter scale. Further, these mechanical properties may be obtained from a single SENB test sample. It is noted that the Poisson's ratio for the SENB test sample H2 described earlier was initially selected to have a value of 0.35. This initially selected value of Poisson's ratio was successful in producing a load-displacement curve that successfully correlated with a load-displacement curve obtained via laboratory testing. However, in a manner similar to that described earlier, the Poisson's ratio may be altered where simulation results do not produce a desired correlation with laboratory testing results. In those instances, the Poisson's ratio may also be iteratively altered to produce correlating results. Where the simulation and laboratory testing results correlate within a desired level, a Poisson's ratio used in correlating simulation results accurately represents the material forming the SENB test sample. In a similar manner, a UTS that accurately represents the material forming an SENB test sample may also be iteratively determined. As a result of the earlier-described iterative approach, several mechanical properties are obtained from a single SENB test sample that are otherwise not determinable directly from the test results of a physical SENB test sample.

Young's modulus, Poisson's ratio, and UTS are example mechanical properties that may be obtained from material test sample and, particularly, SENB test sample, as described earlier. However, the scope of the present disclosure is not so limited. Rather, other mechanical properties may be obtained using the methods described within the present disclosure. For example, other mechanical properties such as cohesive strength and bedding layer frictional angles may also be obtained for samples having bedding layers that are arranged obliquely to a loading direction of the test sample. This applies to other materials that demonstrate elasto-plastic mechanical behavior, including natural materials such as carbonate, sandstone, clay, or human made materials like steel.

The mechanical properties obtained via the described process applied to the SENB test sample H2 are summarized in Table 2. Table 2 also lists the mechanical properties for SENB test sample H1 and H3 that were obtained using a similar methodology.

TABLE 2

Extracted Mechanical Properties for SENB Test Samples H1, H2, and H3 that Have Bedding Layers Perpendicular to a Loading Direction

| Test Sample | Young's modulus, E (GPa) | Poisson's ratio, v | Ultimate Tensile Strength, $\sigma^T$ (MPa) |
|---|---|---|---|
| H1 | 2.8 | 0.35 | 39.0 |
| H2 | 2.4 | 0.35 | 36.5 |
| H3 | 2.3 | 0.35 | 37.0 |

Figure 10:
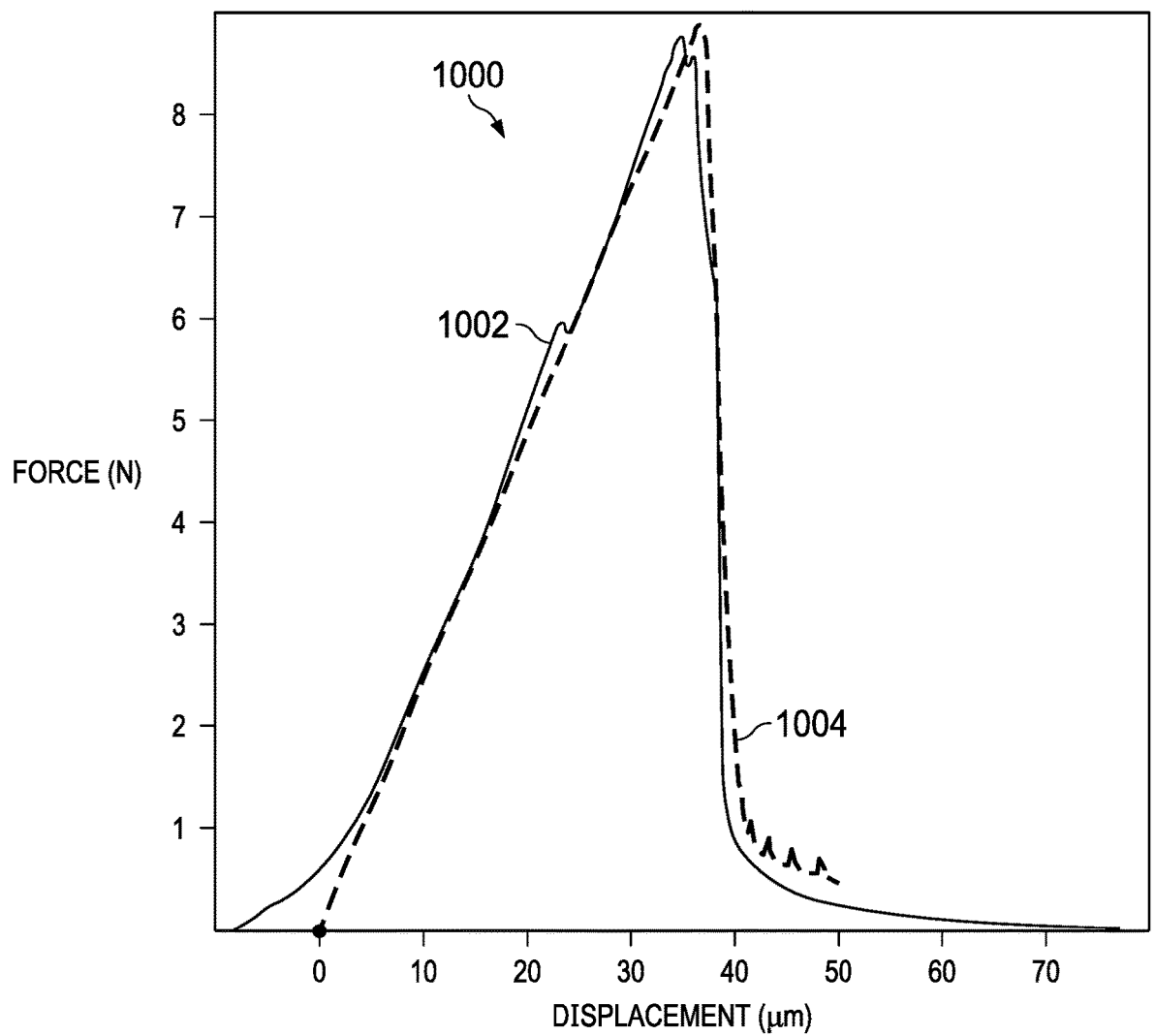

Using this process, the material forming the SENB test sample H3 has a Young's modulus of 2.3 GPa and a UTS of 37 MPa, and the material forming the SENB test sample H1 has a Young's modulus of 2.3 GPa and a UTS of 37 MPa. The extracted Poisson's ratio for both materials of sample H1 and H3 is 0.35. A comparison between the load-displacement curve obtained via simulation and the load-displacement curve obtained via laboratory testing is presented in FIG. 10. FIG. 10 is a plot 1000 that includes a load-displacement curve 1002 obtained from laboratory testing of the material forming the H3 sample and the corresponding load-displacement curve 1004 obtained via simulation. The load-displacement curves 1002 and 1004 achieve a desired level of correlation.

Figure 11:
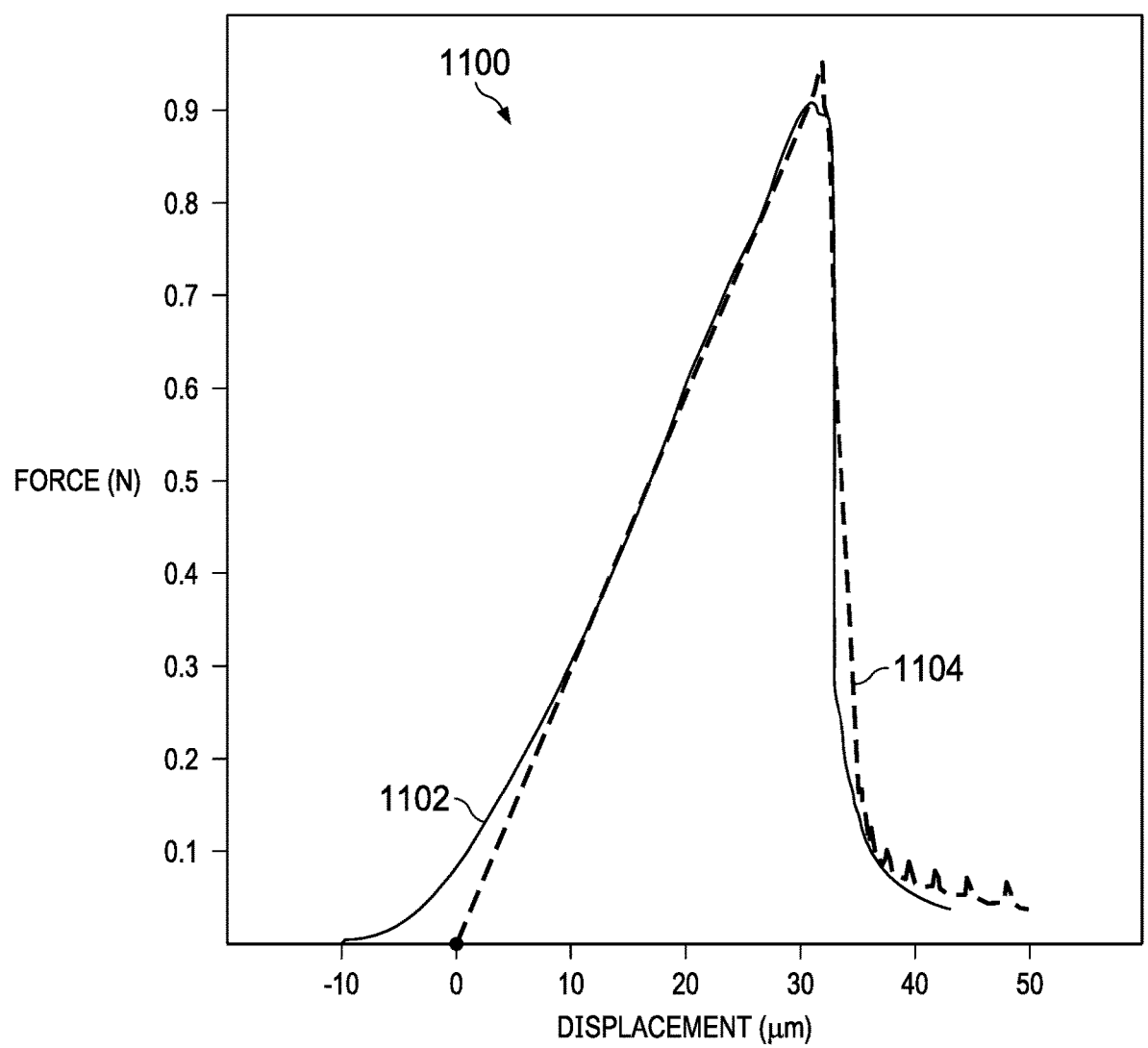

FIG. 11 is a plot 1100 that includes a load-displacement curve 1102 obtained from laboratory testing of the material forming the H1 sample and the corresponding load-displacement curve 1104 obtained via simulation. Similar to the sample H2, the mechanical properties of the material forming the test samples H1 and H3 are obtained by modeling each of the materials using a Mohr-Coulomb model with brittle tensile strength.

Figure 12:
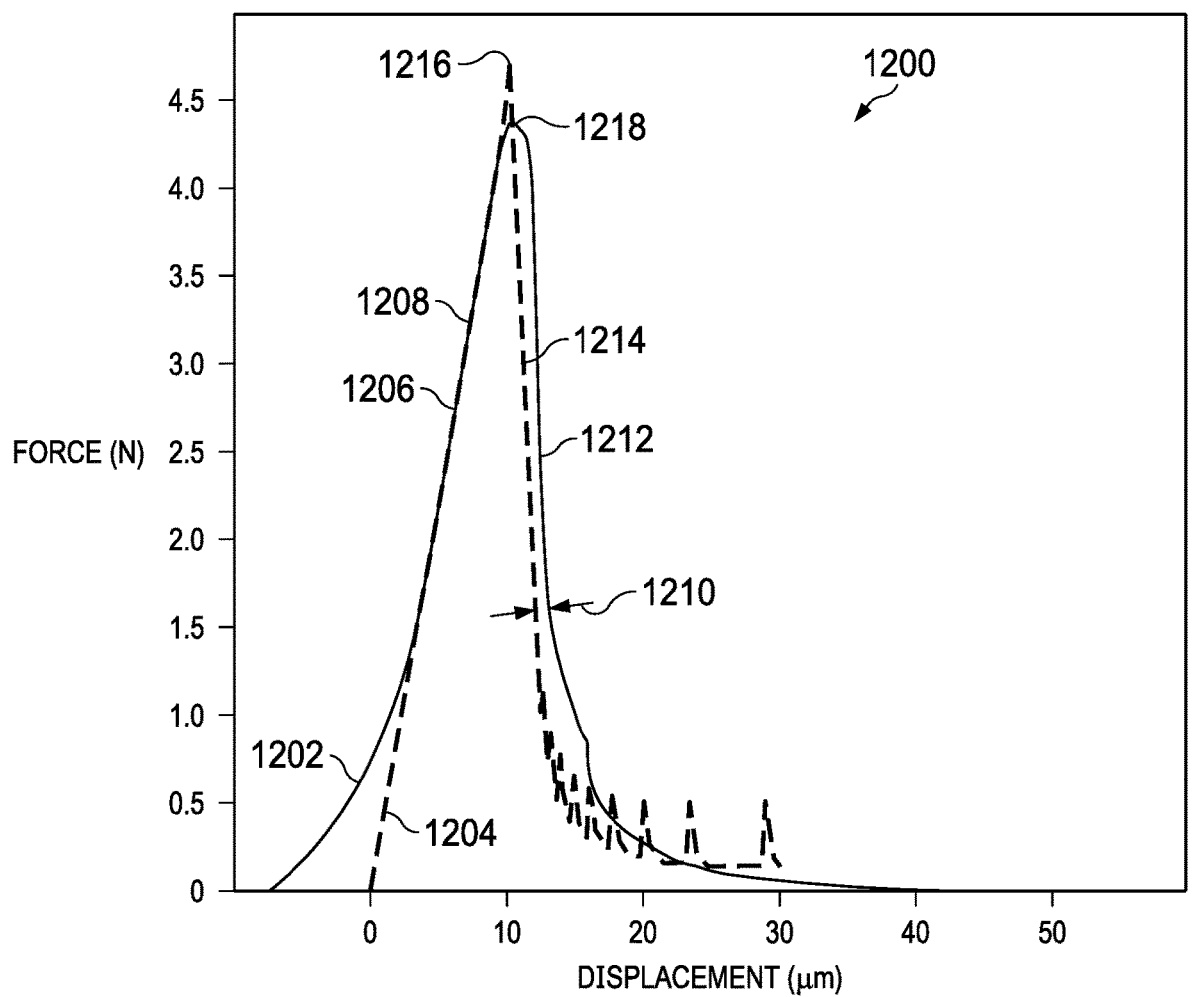
Figure 13:
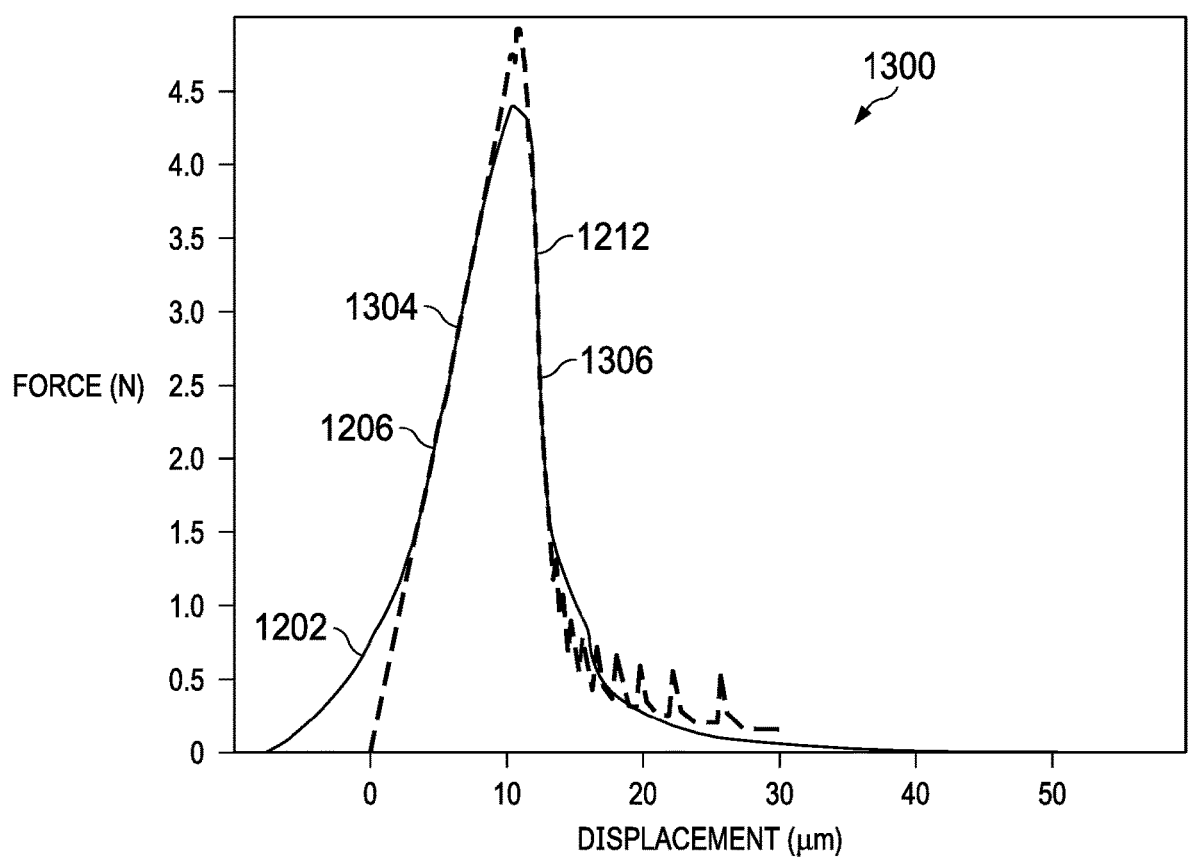

A similar modeling process may be applied to simulate the laboratory test results involving loading that is applied in a direction parallel to bedding layers. Test samples V1, V2, and V3 represent samples having bedding layers oriented in parallel with a loading direction applied to the test sample. FIGS. 12-13 illustrate how a simulated load-displacement curve is correlated with a load-displacement curve obtained via laboratory testing.

FIG. 12 is a plot 1200 that displays a comparison between a load-displacement curve 1202 for test sample V3 obtained via laboratory testing and a simulated load-displacement curve 1204 obtained by using a Young's modulus of 4.8 GPa and tensile strength of 24.0 MPa. The simulated results used to generate the simulated load-displacement curve 1204 were obtained by modeling test sample V3 as a Mohr-Coulomb material with brittle tensile strength. As shown in FIG. 12, a linear-elastic response segment 1206 of the load-displacement curve 1202 has a preselected degree of correlation with a linear-elastic response segment 1208 of the load-displacement curve 1204. As a result, the linear-elastic response segments 1206 and 1208 align. However, a notch 1210 exists between a post-failure segment 1212 of the load-displacement curve 1202 and a post-failure segment 1214 of the load-displacement curve 1204. Also, peak 1216 (which corresponds to the UTS) of the load-displacement curve 1204 also extends beyond a peak 1218 of the load-displacement curve 1202. Because the UTS of the load-displacement curve 1204 does not correlate to the UTS of the load-displacement curve 1202 to a desired level, the Mohr-Coulomb model with brittle tensile strength model of the test sample V3 is replaced with a Mohr-Coulomb model with a strain-softening tensile strength model. A strain-softening model is a variant of a Mohr-Coulomb model, in which the strength properties like cohesive strength, friction angle, and tensile strength will evolve as functions of plastic deformation rather than constants in a traditional Mohr-Coulomb model.

During SENB tests, tensile cracks develop along bedding layers of a test sample having bedding layers that are oriented in parallel with a loading direction. Fillings in the beddings are formed, at least in part, from organic materials, such as kerogen. Kerogen demonstrates strain-softening tensile strength behavior. Thus, KRS retains some residual tensile strength after a tensile crack initiates, and the residual tensile strength reduces gradually as the tensile strain increases. In light of the nature of KRS, the Mohr-Coulomb model with a strain-softening tensile strength model, which is a variant of the Mohr-Coulomb model, provides for softening cohesive strength and frictional angle as a function of plastic shear strain. The Mohr-Coulomb model with a strain-softening tensile strength model also provides for varying tensile strength as a function of plastic tensile strain. The Mohr-Coulomb model with brittle tensile strength, on the other hand, provides for a tensile strength that drops to zero immediately after a tensile crack occurs. As a result, the Mohr-Coulomb model with a strain-softening tensile strength model provides for improved modeling of KRS during an SENB test when loaded in a direction parallel to the orientation of the bedding layers.

FIG. 13 shows a plot 1300 that includes the load-displacement curve 1202 (shown in FIG. 12) along with another simulated load-displacement curve 1302 for test sample V3 produced using the Mohr-Coulomb model with a strain-softening tensile strength model. Similar to the load-displacement curve 1204 (described earlier and shown in FIG. 12), the simulated load-displacement curve 1302 is obtained using a Young's modulus of 4.8 GPa, a Poisson's ratio of 0.35, and a UTS of 24.0 MPa. However, using the strain softening tensile strength model, additional inputs are also used to generate the load-displacement curve 1302. Particularly, the strain-softening tensile model uses a tensile strength of 24.0 MPa at zero plastic strain, a tensile strength of 5.0 MPa at a plastic strain of 0.0001, and a tensile strength of 0.0 MPa at a plastic tensile strain of 0.025 are also used. These strain-softening tensile model values are summarized in Table 4, presented later.

As shown in FIG. 13, a linear-elastic response segment 1304 of the load-displacement curve 1302 is within a desired degree of correlation with the linear-elastic response segment 1206 of the load-displacement curve 1202. Also, the post-failure segment 1212 of the load-displacement curve 1202 is within a desired degree of correlation with a post-failure segment 1306 of the load-displacement curve 1302. As a result, the linear-elastic response segment 1206 and linear-elastic response segment 1304 align, and the post-failure segment 1212 and the post-failure segment 1306 align. In some cases it is difficult to optimize multiple mechanical properties simultaneously. In FIG. 13 UTS affects the peak value of the force-displacement curve but does not directly correspond to the peak value.

Figure 14:
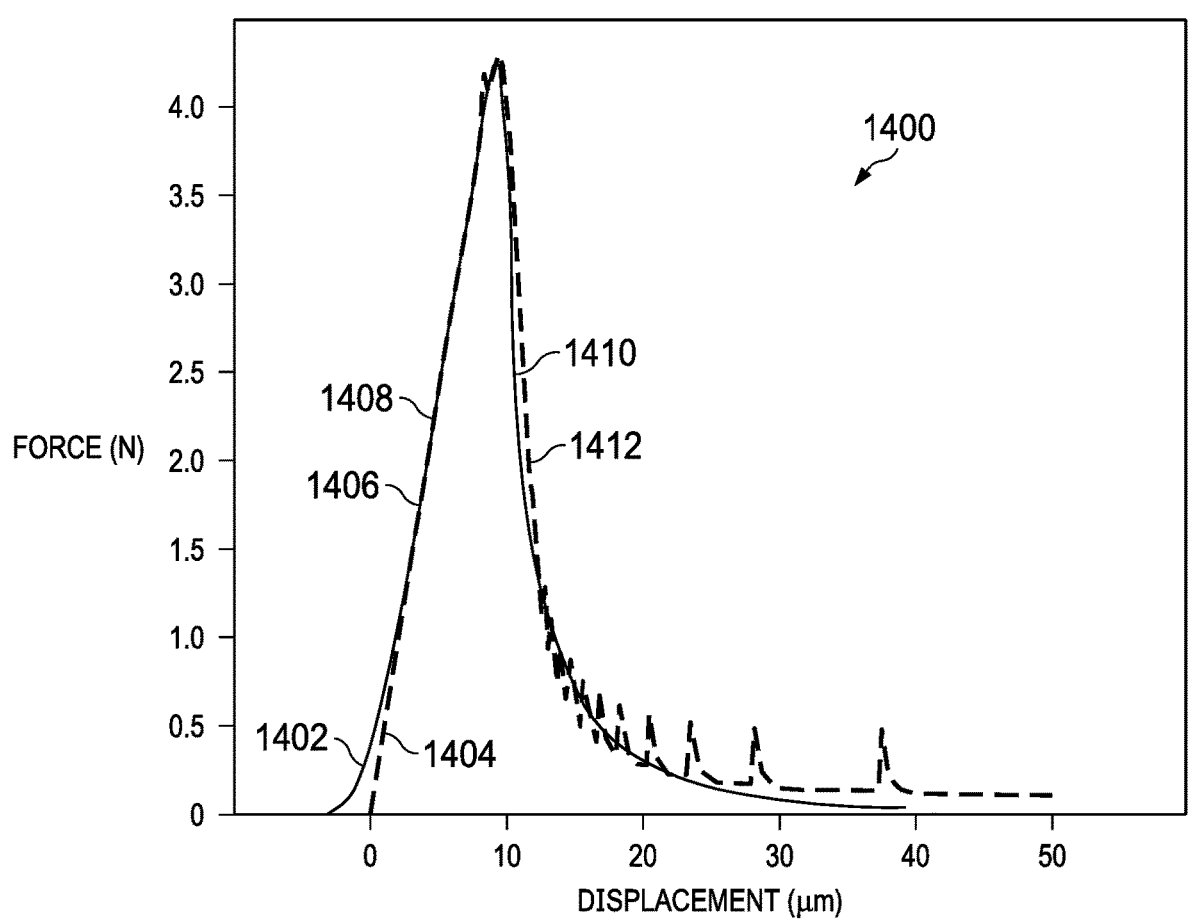

FIG. 14 is a plot 1400 that displays a comparison between a load-displacement curve 1402 obtained from laboratory testing and a load-displacement curve 1404 based on simulated results for the V2 test sample. The simulated load-displacement curve 1404 is generated using the Mohr-Coulomb model with a strain-softening tensile strength model. The load-displacement curve 1404 is obtained using a Young's modulus 5.2 GPa, a Poisson's ratio of 0.35, and a UTS of 20.5 MPa. The strain-softening tensile strength behavior was modeled using a tensile strength of 21.0 MPa at zero plastic strain; a tensile strength of 8.0 MPa at a plastic strain of 0.0001; and a tensile strength of 0.0 MPa at a plastic strain of 0.025.

Using these values, a linear-elastic segment 1406 of the load-displacement curve 1402 and a linear-elastic segment 1408 of the load-displacement curve 1404 align and are within a desired level of correlation. Similarly, a post-failure segment 1410 of the load-displacement curve 1402 and a post-failure segment 1412 of the load-displacement curve 1404 have a desired level of correlation.

Figure 15:
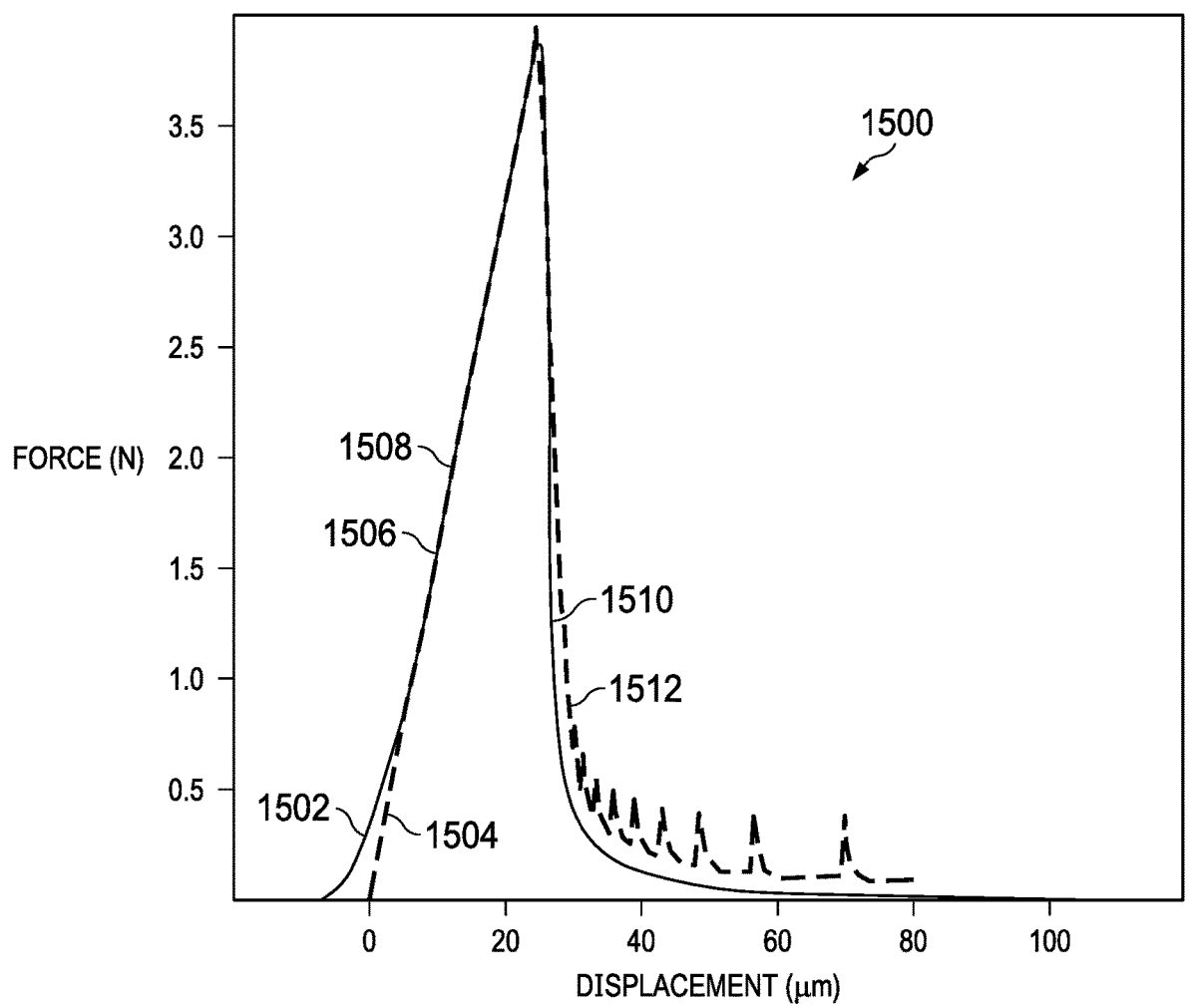

FIG. 15 is a plot 1500 that displays a comparison between a load-displacement curve 1502 obtained from laboratory testing and a load-displacement curve 1504 based on simulated results for the V1 test sample. The simulated load-displacement curve 1504 is generated using the Mohr-Coulomb model with a strain-softening tensile strength model. The load-displacement curve 1504 is obtained using a Young's modulus 1.7 GPa, a Poisson's ratio of 0.35, and a UTS of 20.5 MPa. The strain-softening tensile strength behavior was modeled using a tensile strength of 20.5 MPa at zero plastic strain; a tensile strength of 3.0 MPa at a plastic strain of 0.0001; and a tensile strength of 0.0 MPa at a plastic strain of 0.025.

Using these values, a linear-elastic segment 1506 of the load-displacement curve 1502 and a linear-elastic segment 1508 of the load-displacement curve 1504 align and are within a desired level of correlation. Similarly, a post-failure segment 1510 of the load-displacement curve 1502 and a post-failure segment 1512 of the load-displacement curve 1504 have a desired level of correlation.

The mechanical properties obtained via the described process applied to the SENB test samples V1, V2, and V3 are summarized in Table 2.

TABLE 3

Extracted Mechanical Properties for SENB Test Samples H1, H2, and H3 that Have Bedding Layers Parallel to a Loading Direction

| Test Sample | Young's modulus, E (GPa) | Poisson's ratio, v | Ultimate Tensile Strength, $\sigma^T$ (MPa) |
|---|---|---|---|
| H1 | 2.8 | 0.35 | 39.0 |
| H2 | 2.4 | 0.35 | 36.5 |
| H3 | 2.3 | 0.35 | 37.0 |

The strain-softening tensile strength modeling values used to obtain the simulated load-displacement curves 1204, 1304, 1404, and 1504 are shown in Table 4.

| | Strain-Softening Tensile Strength Values | |
|---|---|---|
| Test Sample | Strain | Tensile Strength (MPa) |
| V1 | 0.0 | 20.5 |
| | 0.0001 | 4.3 |
| | 0.01 | 0.0 |
| V2 | 0.0 | 21.0 |
| | 0.0002 | 8.0 |
| | 0.025 | 0.0 |
| V3 | 0.0 | 24.0 |
| | 0.0001 | 5.0 |
| | 0.025 | 0.0 |

Table 4 and Strain-Softening Tensile Strength Modeling Values

Although the described examples use a homogenous elastic-plastic materials model to simulate the performance of KRS material, the numerical models satisfactorily reproduce load-displacement behaviors of all six of the described SENB test samples (that is, test samples H1, H2, H3, V1, V2, and V3). Thus, the successful modeling validates an underlying assumption that bedding layers form the primary structure of the KRS material and dominates the mechanical response of the KRS material at a millimeter scale.

By matching the load-displacement curve obtained from experimental measurements during laboratory testing with the load-displacement curve determined by numerical simulation, mechanical properties, such as Young's modulus and UTS, are extractable from the experimental measurements. Simulations consistently indicate that the mechanical response of a SENB sample is dominated by the rock matrix when bedding layers are perpendicular to the loading direction but are dominated by bedding material when the bedding layers are in parallel with the loading direction. The rock matrix of the KRS test samples demonstrates brittle tensile behavior, but the bedding material demonstrates a more ductile or strain-softening tensile behavior.

Figure 16:
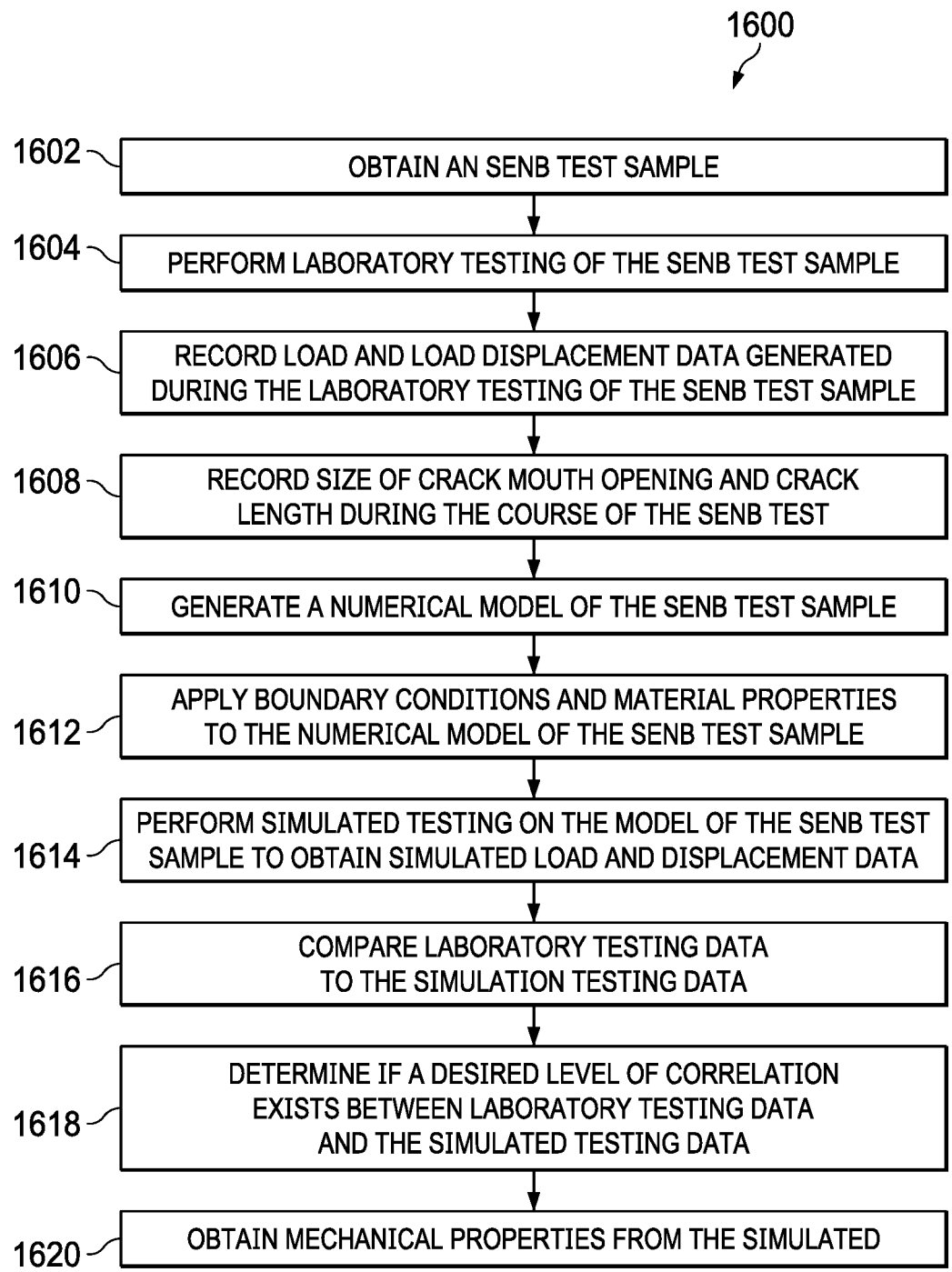
FIG. 16 is an example method of determining material properties of formation rock using SENB laboratory testing data and simulation test data.

FIG. 16 is a flowchart of an example method 1600 for obtaining multiple mechanical properties using a single, millimeter-scale SENB test sample. At 1602, an SENB test sample is obtained. In some implementations, the test sample is a millimeter-scale piece of formation rock that may be obtained from drilling cuttings. The millimeter-scale piece of rock is prepared into the form of an SENB test sample. At 1604, the SENB test sample is tested. In some implementations, the SENB test sample is installed into a test machine by placing the SENB test sample on support anvils of the testing machine. A loading anvil applies a load to the SENB test sample at a selected rate. For example, the loading anvil is displaced at a selected rate. At 1606, load and displacement data associated with loading applied by a loading anvil during laboratory testing are collected and recorded. At 1608, a length of a crack initiated at a notch formed in the SENB test sample and an opening size of the crack mouth are measured and recorded. The crack length and crack mouth opening size may be measured using imaging techniques. For example, a camera may be used to take numerous images per second of the SENB test sample during testing. The rate of image capture may be selected to catch initiation and propagation of the crack. An image capture rate may be with a range of 6000 fps up to 1,000,000 fps. Other image recording rates may be used.

At 1610, a numerical model is generated for the SENB test sample. The numerical model may have a mesh of selected size. At 1612, boundary conditions and material properties are applied to the numerical model. Example boundary conditions may include identifying supporting anvil locations, a loading anvil location, an applied loading direction, and an applied loading velocity. In some implementations, a loading velocity may be selected to establish a quasi-static loading process and, as a result, reduce computational resources used to perform a simulation of the numerical model. Controlling velocity in the simulation can be more efficient than controlling force in the simulation, however both are possible. In some implementations using force control, multiple simulation cases can be required to traverse a complete force-displacement curve. In some implementations, additional, fewer, or other boundary conditions may be applied. Example material properties include material type, Young's modulus, Poisson's ratio, and ultimate tensile strength. In some implementations, additional, fewer, or different material properties may be applied. At 1614, simulation testing is performed on the numerical model of the SENB test sample to obtain simulated data, such as simulated load and displacement data. In some implementations, a load-displacement chart may be generated using the simulated load and displacement data. At 1616, the simulated testing data is compared to the laboratory testing data. In some implementations, numerical analysis of these data sets is compared to determine whether one or more portions of the simulated data are within a desired level of correlation with the laboratory testing data. For example, a comparison between linear-elastic segments or post-failure segments or both of the different data sets may be compared to determine whether a desired level of correlation exists. Examples of such comparisons are described earlier and may involve plotting both data sets on a single chart.

Prior to determining whether the simulation data are within a desired level of correlation, the simulation data may be manipulated on the chart relative to the laboratory testing data. For example, the simulation data may be shifted relative to the laboratory testing data in a manner similar to that described earlier in the context of FIG. 8. The one or more portions of the simulation data may be within a desired level of correlation when, for example, a difference between the simulation data and the counterpart laboratory testing data is equal to or less than a selected value or when or a difference is within a predefined range. As explained earlier, if the one or more portions of the simulation data and the laboratory testing data are within a desired level of correlation, the method 1600 moves to 1620 where mechanical properties of the formation rock that forms the SENB test sample are determined. If the one or more portions of the simulation data and the laboratory testing data are not within a desired level of correlation, new boundary conditions or material properties or both are applied to the numerical model at 1612 in anticipation of performance of a new simulation test on the numerical model. At 1614, a new simulation test is performed on the numerical model with the newly applied boundary conditions, material properties, or both. At 1616, the newly acquired simulation results are compared to the laboratory testing data. At 1618, it is determined whether a desired level of correlation exists between the data sets. If a desired level of correlation exits, the method moves to 1620. If a desired level of correlation does not exist, the method 1600 returns to 1612 where an iterative process continues to refine the simulation data until a desired level of correlation exists; a number of iterative steps has occurred; or a rate at which the simulation data converges with the laboratory testing data reaches a selected level. Once the simulation data converges to a desired level of correlation with the laboratory testing data, the number of iterative steps are completed, or once a rate of convergence corresponds with a selected rate of convergence, the method 1600 moves to 1620 where the material properties are obtained, as explained earlier.

Figure 17:
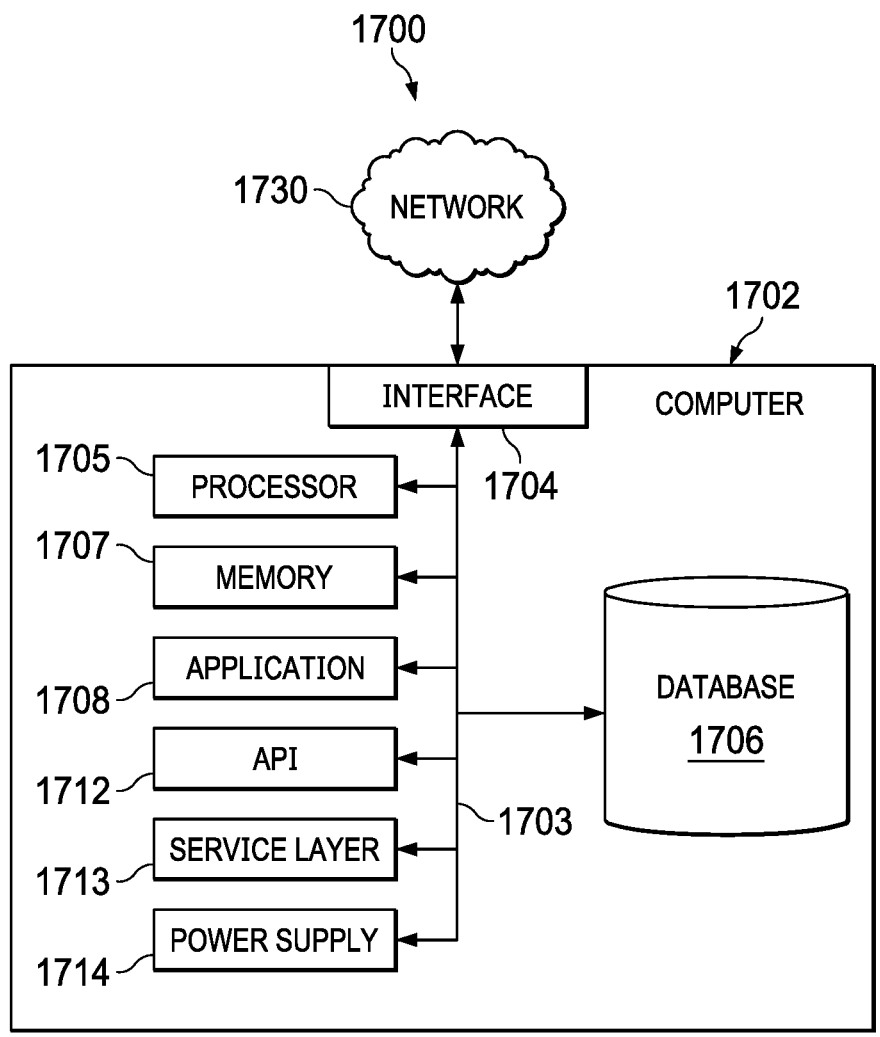
FIG. 17 is a block diagram illustrating an example computer system used to provide computational functionalities associated with described algorithms, methods, functions, processes, flows, and procedures as described in the present disclosure, according to some implementations of the present disclosure.

FIG. 17 is a block diagram of an example computer system 1700 used to provide computational functionalities associated with algorithms, methods, functions, processes, flows, and procedures described in the present disclosure, according to some implementations of the present disclosure. The illustrated computer 1702 is intended to encompass any computing device such as a server, a desktop computer, a laptop/notebook computer, a wireless data port, a smart phone, a personal data assistant (PDA), a tablet computing device, or one or more processors within these devices, including physical instances, virtual instances, or both. The computer 1702 can include input devices such as keypads, keyboards, and touch screens that can accept user information. Also, the computer 1702 can include output devices that can convey information associated with the operation of the computer 1702. The information can include digital data, visual data, audio information, or a combination of information. The information can be presented in a graphical user interface (UI) (or GUI).

The computer 1702 can serve in a role as a client, a network component, a server, a database, a persistency, or components of a computer system for performing the subject matter described in the present disclosure. The illustrated computer 1702 is communicably coupled with a network 1730. In some implementations, one or more components of the computer 1702 can be configured to operate within different environments, including cloud-computing-based environments, local environments, global environments, and combinations of environments.

At a high level, the computer 1702 is an electronic computing device operable to receive, transmit, process, store, and manage data and information associated with the described subject matter. According to some implementations, the computer 1702 can also include, or be communicably coupled with, an application server, an email server, a web server, a caching server, a streaming data server, or a combination of servers.

The computer 1702 can receive requests over network 1730 from a client application (for example, executing on another computer 1702). The computer 1702 can respond to the received requests by processing the received requests using software applications. Requests can also be sent to the computer 1702 from internal users (for example, from a command console), external (or third) parties, automated applications, entities, individuals, systems, or computers.

Each of the components of the computer 1702 can communicate using a system bus 1703. In some implementations, any or all of the components of the computer 1702, including hardware or software components, can interface with each other or the interface 1704 (or a combination of both), over the system bus 1703. Interfaces can use an application programming interface (API) 1712, a service layer 1713, or a combination of the API 1712 and service layer 1713. The API 1712 can include specifications for routines, data structures, and object classes. The API 1712 can be either computer-language independent or dependent. The API 1712 can refer to a complete interface, a single function, or a set of APIs.

The service layer 1713 can provide software services to the computer 1702 and other components (whether illustrated or not) that are communicably coupled to the computer 1702. The functionality of the computer 1702 can be accessible for all service consumers using this service layer. Software services, such as those provided by the service layer 1713, can provide reusable, defined functionalities through a defined interface. For example, the interface can be software written in JAVA, C++, or a language providing data in extensible markup language (XML) format. While illustrated as an integrated component of the computer 1702, in alternative implementations, the API 1712 or the service layer 1713 can be stand-alone components in relation to other components of the computer 1702 and other components communicably coupled to the computer 1702. Moreover, any or all parts of the API 1712 or the service layer 1713 can be implemented as child or sub-modules of another software module, enterprise application, or hardware module without departing from the scope of the present disclosure.

The computer 1702 includes an interface 1704. Although illustrated as a single interface 1704 in FIG. 17, two or more interfaces 1704 can be used according to particular needs, desires, or implementations of the computer 1702 and the described functionality. The interface 1704 can be used by the computer 1702 for communicating with other systems that are connected to the network 1730 (whether illustrated or not) in a distributed environment. Generally, the interface 1704 can include, or be implemented using, logic encoded in software or hardware (or a combination of software and hardware) operable to communicate with the network 1730. More specifically, the interface 1704 can include software supporting one or more communication protocols associated with communications. As such, the network 1730 or the interface's hardware can be operable to communicate physical signals within and outside of the illustrated computer 1702.

The computer 1702 includes a processor 1705. Although illustrated as a single processor 1705 in FIG. 17, two or more processors 1705 can be used according to particular needs, desires, or implementations of the computer 1702 and the described functionality. Generally, the processor 1705 can execute instructions and can manipulate data to perform the operations of the computer 1702, including operations using algorithms, methods, functions, processes, flows, and procedures as described in the present disclosure.

The computer 1702 also includes a database 1706 that can hold data for the computer 1702 and other components connected to the network 1730 (whether illustrated or not). For example, database 1706 can be an in-memory, conventional, or a database storing data consistent with the present disclosure. In some implementations, database 1706 can be a combination of two or more different database types (for example, hybrid in-memory and conventional databases)

according to particular needs, desires, or implementations of the computer 1702 and the described functionality. Although illustrated as a single database 1706 in FIG. 17, two or more databases (of the same, different, or a combination of types) can be used according to particular needs, desires, or implementations of the computer 1702 and the described functionality. While database 1706 is illustrated as an internal component of the computer 1702, in alternative implementations, database 1706 can be external to the computer 1702.

The computer 1702 also includes a memory 1707 that can hold data for the computer 1702 or a combination of components connected to the network 1730 (whether illustrated or not). Memory 1707 can store any data consistent with the present disclosure. In some implementations, memory 1707 can be a combination of two or more different types of memory (for example, a combination of semiconductor and magnetic storage) according to particular needs, desires, or implementations of the computer 1702 and the described functionality. Although illustrated as a single memory 1707 in FIG. 17, two or more memories 1707 (of the same, different, or combination of types) can be used according to particular needs, desires, or implementations of the computer 1702 and the described functionality. While memory 1707 is illustrated as an internal component of the computer 1702, in alternative implementations, memory 1707 can be external to the computer 1702.

The application 1708 can be an algorithmic software engine providing functionality according to particular needs, desires, or implementations of the computer 1702 and the described functionality. For example, application 1708 can serve as one or more components, modules, or applications. Further, although illustrated as a single application 1708, the application 1708 can be implemented as multiple applications 1708 on the computer 1702. In addition, although illustrated as internal to the computer 1702, in alternative implementations, the application 1708 can be external to the computer 1702.

The computer 1702 can also include a power supply 1714. The power supply 1714 can include a rechargeable or non-rechargeable battery that can be configured to be either user- or non-user-replaceable. In some implementations, the power supply 1714 can include power-conversion and management circuits, including recharging, standby, and power management functionalities. In some implementations, the power-supply 1714 can include a power plug to allow, for example, the computer 1702 to be plugged into a wall socket or a power source to power the computer 1702 or recharge a rechargeable battery.

There can be any number of computers 1702 associated with, or external to, a computer system containing computer 1702, with each computer 1702 communicating over network 1730. Further, the terms "client," "user," and other appropriate terminology can be used interchangeably, as appropriate, without departing from the scope of the present disclosure. Moreover, the present disclosure contemplates that many users can use one computer 1702, and one user can use multiple computers 1702.

Described implementations of the subject matter can include one or more features, alone or in combination.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs. Each computer program can include one or more modules of computer program instructions encoded on a tangible, non-transitory, computer-readable computer-storage medium for execution by, or to control the operation of, data processing apparatus. Alternatively, or additionally, the program instructions can be encoded in or on an artificially generated propagated signal. For example, the signal can be a machine-generated electrical, optical, or electromagnetic signal that is generated to encode information for transmission to a suitable receiver apparatus for execution by a data processing apparatus. The computer-storage medium can be a machine-readable storage device, a machine-readable storage substrate, a random or serial access memory device, or a combination of computer-storage mediums.

The terms "data processing apparatus," "computer," and "electronic computer device" (or equivalent as understood by one of ordinary skill in the art) refer to data processing hardware. For example, a data processing apparatus can encompass all kinds of apparatuses, devices, and machines for processing data, including by way of example, a programmable processor, a computer, or multiple processors or computers. The apparatus can also include special purpose logic circuitry including, for example, a central processing unit (CPU), a field-programmable gate array (FPGA), or an application specific integrated circuit (ASIC). In some implementations, the data processing apparatus or special purpose logic circuitry (or a combination of the data processing apparatus or special purpose logic circuitry) can be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, such as LINUX, UNIX, WINDOWS, MAC OS, ANDROID, or IOS.

A computer program, which can also be referred to or described as a program, software, a software application, a module, a software module, a script, or code, can be written in any form of programming language. Programming languages can include, for example, compiled languages, interpreted languages, declarative languages, or procedural languages. Programs can be deployed in any form, including as standalone programs, modules, components, subroutines, or units for use in a computing environment. A computer program can, but need not, correspond to a file in a file system. A program can be stored in a portion of a file that holds other programs or data, for example, one or more scripts stored in a markup language document, in a single file dedicated to the program in question, or in multiple coordinated files storing one or more modules, subprograms, or portions of code. A computer program can be deployed for execution on one computer or on multiple computers that are located, for example, at one site or distributed across multiple sites that are interconnected by a communication network. While portions of the programs illustrated in the various figures may be shown as individual modules that implement the various features and functionality through various objects, methods, or processes, the programs can instead include a number of sub-modules, third-party services, components, and libraries. Conversely, the features and functionality of various components can be combined into single components as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and the apparatus can also be implemented as, special purpose logic circuitry, for example, a CPU, an FPGA, or an ASIC.

Computers suitable for the execution of a computer program can be based on one or more of general and special purpose microprocessors and other kinds of CPUs. The elements of a computer are a CPU for performing or executing instructions and one or more memory devices for storing instructions and data. Generally, a CPU can receive instructions and data from (and write data to) a memory. A computer can also include, or be operatively coupled to, one or more mass storage devices for storing data. In some implementations, a computer can receive data from, and transfer data to, the mass storage devices including, for example, magnetic, magneto optical, or optical disks. Moreover, a computer can be embedded in another device, for example, a mobile telephone, a personal digital assistant (PDA), a mobile audio or video player, a game console, a global positioning system (GPS) receiver, or a portable storage device such as a universal serial bus (USB) flash drive.

Computer readable media (transitory or non-transitory, as appropriate) suitable for storing computer program instructions and data can include all forms of permanent/non-permanent and volatile/non volatile memory, media, and memory devices. Computer readable media can include, for example, semiconductor memory devices such as random access memory (RAM), read only memory (ROM), phase change memory (PRAM), static random access memory (SRAM), dynamic random access memory (DRAM), erasable programmable read-only memory (EPROM), electrically erasable programmable read-only memory (EEPROM), and flash memory devices. Computer readable media can also include, for example, magnetic devices such as tapes, cartridges, cassettes, and internal/removable disks. Computer readable media can also include magneto optical disks and optical memory devices and technologies including, for example, digital video disc (DVD), CD ROM, DVD+/−R, DVD-RAM, DVD-ROM, HD-DVD, and BLU-RAY. The memory can store various objects or data, including caches, classes, frameworks, applications, modules, backup data, jobs, web pages, web page templates, data structures, database tables, repositories, and dynamic information. Types of objects and data stored in memory can include parameters, variables, algorithms, instructions, rules, constraints, and references. Additionally, the memory can include logs, policies, security or access data, and reporting files. The processor and the memory can be supplemented by, or incorporated into, special purpose logic circuitry.

Implementations of the subject matter described in the present disclosure can be implemented on a computer having a display device for providing interaction with a user, including displaying information to, and receiving input from, the user. Types of display devices can include, for example, a cathode ray tube (CRT), a liquid crystal display (LCD), a light-emitting diode (LED), and a plasma monitor. Display devices can include a keyboard and pointing devices including, for example, a mouse, a trackball, or a trackpad. User input can also be provided to the computer through the use of a touchscreen, such as a tablet computer surface with pressure sensitivity or a multi-touch screen using capacitive or electric sensing. Other kinds of devices can be used to provide for interaction with a user, including receiving user feedback which includes, for example, sensory feedback including visual feedback, auditory feedback, or tactile feedback. Input from the user can be received in the form of acoustic, speech, or tactile input. In addition, a computer can interact with a user by sending documents to, and receiving documents from, a device that the user uses. For example, the computer can send web pages to a web browser on a user's client device in response to requests received from the web browser.

The term "graphical user interface," or "GUI," can be used in the singular or the plural to describe one or more graphical user interfaces and each of the displays of a particular graphical user interface. Therefore, a GUI can represent any graphical user interface, including, but not limited to, a web browser, a touch-screen, or a command line interface (CLI) that processes information and efficiently presents the information results to the user. In general, a GUI can include a plurality of user interface (UI) elements, some or all associated with a web browser, such as interactive fields, pull-down lists, and buttons. These and other UI elements can be related to or represent the functions of the web browser.

Implementations of the subject matter described in this specification can be implemented in a computing system that includes a back end component, for example, as a data server, or that includes a middleware component, for example, an application server. Moreover, the computing system can include a front-end component, for example, a client computer having one or both of a graphical user interface or a Web browser through which a user can interact with the computer. The components of the system can be interconnected by any form or medium of wireline or wireless digital data communication (or a combination of data communication) in a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) (for example, using 802.11 a/b/g/n or 802.20 or a combination of protocols), all or a portion of the Internet, or any other communication system or systems at one or more locations (or a combination of communication networks). The network can communicate with, for example, Internet Protocol (IP) packets, frame relay frames, asynchronous transfer mode (ATM) cells, voice, video, data, or a combination of communication types between network addresses.

The computing system can include clients and servers. A client and server can generally be remote from each other and can typically interact through a communication network. The relationship of client and server can arise by virtue of computer programs running on the respective computers and having a client-server relationship.

Cluster file systems can be any file system type accessible from multiple servers for read and update. Locking or consistency tracking may not be necessary since the locking of exchange file system can be done at the application layer. Furthermore, Unicode data files can be different from non-Unicode data files.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations. It should be understood that the described program components and systems can generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

Furthermore, any claimed implementation is considered to be applicable to at least a computer-implemented method; a non-transitory, computer-readable medium storing computer-readable instructions to perform the computer-implemented method; and a computer system including a computer memory interoperably coupled with a hardware processor configured to perform the computer-implemented method or the instructions stored on the non-transitory, computer-readable medium.

A number of implementations of the present disclosure have been described. Nevertheless, it will be understood that various modifications may be made without departing from the spirit and scope of the invention. Accordingly, other implementations are within the scope of the following claims.

What is claimed is:

1. A computer-implemented method, comprising:
    performing laboratory testing of at least two single edge notched beam (SENB) test samples formed from formation rock by:
        loading a first SENB test sample of the at least two SENB test samples in a direction perpendicular to one or more bedding layers of the formation rock of the first SENB test sample, and
        loading a second SENB test sample of the at least two SENB test samples in a direction parallel to one or more bedding layers of the formation rock of the second SENB test sample;
    recording laboratory testing data obtained from the laboratory testing;
    for each SENB test sample of the at least two SENB test samples:
        determining one or more elastic parameters of a material representing the formation rock by performing a first set of one or more simulations on a numerical model corresponding to the respective SENB test sample and determining when a first variance between a linear-elastic segment of a load-displacement curve generated from simulation data of the first set of one or more simulations and a linear-elastic segment of a load-displacement curve generated from the laboratory testing data is within a first predetermined level or correlation;
        determining an ultimate tensile strength of the material representing the formation rock by estimating an ultimate tensile strength of the material representing the formation rock based on a peak load of the laboratory testing data, performing a second set of one or more simulations on the numerical model corresponding to the respective SENB test sample using the determined one or more elastic parameters, and determining when a second variance between a peak of a load-displacement curve generated from simulation data of the second set of one or more simulations and a peak of the load-displacement curve generated from the laboratory testing data is within a second predetermined level or correlation; and
        determining one or more plastic parameters of the material representing the formation rock by performing a third set of one or more simulations on the numerical model corresponding to the respective SENB test sample using the determined one or more elastic parameters and the determined ultimate tensile strength, and determining when a third variance between a crack-propagation segment of a load-displacement curve generated from simulation data of the third set of one or more simulations and a crack-propagation segment of the load-displacement curve generated from the laboratory testing data is within a third predetermined level or correlation;
    wherein the determined one or more elastic parameters, the determined ultimate tensile strength, and the determined one or more plastic parameters for the at least two SENB test samples represent linear-elastic behavior, peak loading behavior, and crack-propagation behavior of the formation rock for both perpendicular loading and parallel loading of the formation rock.

2. The computer-implemented method of claim 1, further comprising forming the at least two SENB test samples as millimeter-scale test samples from drill cuttings of the formation rock.

3. A non-transitory, computer-readable medium storing one or more instructions executable by a computer system to perform operations comprising:
    performing laboratory testing of at least two single edge notched beam (SENB) test samples formed from formation rock by:
        loading a first SENB test sample of the at least two SENB test samples in a direction perpendicular to one or more bedding layers of the formation rock of the first SENB test sample, and
        loading a second SENB test sample of the at least two SENB test samples in a direction parallel to one or more bedding layers of the formation rock of the second SENB test sample;

recording laboratory testing data obtained from the laboratory testing;

for each SENB test sample of the at least two SENB test samples:

determining one or more elastic parameters of a material representing the formation rock by performing a first set of one or more simulations on a numerical model corresponding to the respective SENB test sample and determining when a first variance between a linear-elastic segment of a load-displacement curve generated from simulation data of the first set of one or more simulations and a linear-elastic segment of a load-displacement curve generated from the laboratory testing data is within a first predetermined level or correlation;

determining an ultimate tensile strength of the material representing the formation rock by estimating an ultimate tensile strength of the material representing the formation rock based on a peak load of the laboratory testing data, performing a second set of one or more simulations on the numerical model corresponding to the respective SENB test sample using the determined one or more elastic parameters, and determining when a second variance between a peak of a load-displacement curve generated from simulation data of the second set of one or more simulations and a peak of the load-displacement curve generated from the laboratory testing data is within a second predetermined level or correlation; and determining one or more plastic parameters of the material representing the formation rock by performing a third set of one or more simulations on the numerical model corresponding to the respective SENB test sample using the determined one or more elastic parameters and the determined ultimate tensile strength, and determining when a third variance between a crack-propagation segment of a load-displacement curve generated from simulation data of the third set of one or more simulations and a crack-propagation segment of the load-displacement curve generated from the laboratory testing data is within a third predetermined level or correlation;

wherein the determined one or more elastic parameters, the determined ultimate tensile strength, and the determined one or more plastic parameters for the at least two SENB test samples represent linear-elastic behavior, peak loading behavior, and crack-propagation behavior of the formation rock for both perpendicular loading and parallel loading of the formation rock.

4. The non-transitory, computer-readable medium of claim 3, further comprising forming the at least two SENB test samples as millimeter-scale test samples from drill cuttings of the formation rock.

5. A computer-implemented system, comprising:
one or more processors; and
a non-transitory computer-readable storage medium coupled to the one or more processors and storing programming instructions for execution by the one or more processors, the programming instructions instructing the one or more processors to:

perform laboratory testing of at least two single edge notched beam (SENB) test samples formed from formation rock by:

loading a first SENB test sample of the at least two SENB test samples in a direction perpendicular to one or more bedding layers of the formation rock of the first SENB test sample, and loading a second SENB test sample of the at least two SENB test samples in a direction parallel to one or more bedding layers of the formation rock of the second SENB test sample;

record laboratory testing data obtained from the laboratory testing;

for each SENB test sample of the at least two SENB test samples:

determining one or more elastic parameters of a material representing the formation rock by performing a first set of one or more simulations on a numerical model corresponding to the respective SENB test sample and determining when a first variance between a linear-elastic segment of a load-displacement curve generated from simulation data of the first set of one or more simulations and a linear-elastic segment of a load-displacement curve generated from the laboratory testing data is within a first predetermined level or correlation;

determining an ultimate tensile strength of the material representing the formation rock by estimating an ultimate tensile strength of the material representing the formation rock based on a peak load of the laboratory testing data, performing a second set of one or more simulations on the numerical model corresponding to the respective SENB test sample using the determined one or more elastic parameters, and determining when a second variance between a peak of a load-displacement curve generated from simulation data of the second set of one or more simulations and a peak of the load-displacement curve generated from the laboratory testing data is within a second predetermined level or correlation; and determining one or more plastic parameters of the material representing the formation rock by performing a third set of one or more simulations on the numerical model corresponding to the respective SENB test sample with the determined one or more elastic parameters and the determined ultimate tensile strength, and determining when a third variance between a crack-propagation segment of a load-displacement curve generated from simulation data of the third set of one or more simulations and a crack-propagation segment of the load-displacement curve generated from the laboratory testing data is within a third predetermined level or correlation;

wherein the determined one or more elastic parameters, the determined ultimate tensile strength, and the determined one or more plastic parameters for the at least two SENB test samples represent linear-elastic behavior, peak loading behavior, and crack-propagation behavior of the formation rock for both perpendicular loading and parallel loading of the formation rock.

6. The computer-implemented system of claim 5, further comprising programming instructions operable to cause the one or more processors to perform an iterative loop for a selected number of cycles or until the first variance, the second variance, or the third variance are within the first predetermined level of correlation, the second predetermined level of correlation, or the third predetermined level of correlation, respectively.

7. The computer-implemented method of claim 1, further comprising drilling the formation rock to produce drill cuttings and forming the at least two SENB test samples from the drill cuttings of the formation rock.

8. The computer-implemented method of claim 2, wherein the millimeter-scale test samples have a length between 8 mm and 12 mm, a height between 3 mm and 4 mm, and a thickness of about 1 mm; and the millimeter-scale test samples include a notch having a length-to-width ratio of between 0.2 and 0.6.

9. The computer-implemented method of claim 1, wherein performing the laboratory testing comprises:
    performing a three-point bend test of the first SENB test sample to load the first SENB test sample in the direction perpendicular to one or more bedding layers of the formation rock of the first SENB test sample and cause a crack to propagate through the first SENB test sample in the direction perpendicular to one or more bedding layers; and
    performing a three-point bend test of the second SENB test sample to load the second SENB test sample in the direction parallel to one or more bedding layers of the formation rock of the second SENB test sample and cause a crack to propagate through the second SENB test sample in the direction parallel to one or more bedding layers.

10. The computer-implemented method of claim 1, wherein the linear-elastic segment represents a segment prior to an initiation of a crack of the respective SENB test sample, and the crack-propagation segment represents a segment where a propagation of the crack of the respective SENB sample has initiated.

11. The computer-implemented method of claim 10, wherein the crack initiates from a notch of the respective SENB test sample and propagates in the direction perpendicular to one or more bedding layers or the direction parallel to one or more bedding layers.

12. The non-transitory, computer-readable medium of claim 3, wherein the linear-elastic segment represents a segment prior to an initiation of a crack of the respective SENB test sample, and the crack-propagation segment represents a segment where a propagation of the crack of the respective SENB sample has initiated.

13. The non-transitory, computer-readable medium of claim 12, wherein the crack initiates from a notch of the respective SENB test sample and propagates in the direction perpendicular to one or more bedding layers or the direction parallel to one or more bedding layers.

14. The computer-implemented system of claim 5, wherein the linear-elastic segment represents a segment prior to an initiation of a crack of the respective SENB test sample, and the crack-propagation segment represents a segment where a propagation of the crack of the respective SENB sample has initiated.

15. The computer-implemented system of claim 14, wherein the crack initiates from a notch of the respective SENB test sample and propagates in the direction perpendicular to one or more bedding layers or the direction parallel to one or more bedding layers.

16. The computer-implemented method of claim 1, comprising:
    iteratively resolving the first set of one or more simulations for each SENB test sample of the at least two SENB test samples until the first variance is within the first predetermined level of correlation;
    iteratively resolving the second set of one or more simulations for each SENB test sample of the at least two SENB test samples until the second variance is within the second predetermined level of correlation; and
    iteratively resolving the third set of one or more simulations for each SENB test sample of the at least two SENB test samples until the third variance is within the third predetermined level of correlation.

17. The computer-implemented method of claim 1, wherein the one or more elastic parameters of the material representing the formation rock comprise a Young's modulus and a Poisson's ratio and the one or more plastic parameters of the material representing the formation rock comprise a cohesive strength and a friction angle.

18. The computer-implemented method of claim 17, wherein the one or more plastic parameters are parameters of a Mohr-Coulomb model with strain-softening tensile strength behavior.

19. The computer-implemented method of claim 17, wherein estimating the ultimate tensile strength of the material representing the formation rock based on the peak load of the laboratory testing data comprises evaluating $\sigma = M*y/I$, where $\sigma$ is the estimated ultimate tensile strength, M is a moment about a neutral axis of the respective SENB test sample, y is a perpendicular distance to the neutral axis of the respective SENB test sample, and I is a second moment of area about the neutral axis of the respective SENB test sample.

20. The computer-implemented method of claim 1, wherein performing laboratory testing of at least two SENB test samples comprises:
    controlling a test machine to perform a three-point bend test on the first SENB test sample at a first loading speed between 0.01 mm/min and 0.10 mm/min of an anvil of the test machine to load the first SENB test sample in the direction perpendicular to one or more bedding layers of the formation rock of the first SENB test sample;
    measuring and recording an applied load of the test machine and the first loading speed of the test machine while performing the three-point bend test on the first SENB test sample;
    controlling the test machine to perform a three-point bend test on the second SENB test sample at a second loading speed between 0.01 mm/min and 0.10 mm/min of the anvil of the test machine to load the second SENB test sample in the direction parallel to one or more bedding layers of the formation rock of the second SENB test sample; and
    measuring and recording an applied load of the test machine and the second loading speed of the test machine while performing the three-point bend test on the second SENB test sample.

21. The computer-implemented method of claim 20, wherein the first SENB test sample is disposed in a three-point bending fixture while the test machine is controlled to perform the three-point bend test on the first SENB test sample and the second SENB test sample is disposed in the three-point bending fixture while the test machine is controlled to perform the three-point bend test on the second SENB test sample.

22. The computer-implemented method of claim 20, wherein performing laboratory testing of the at least two SENB test samples comprises:
    capturing images, by a camera, of the three-point bend test of the first SENB test sample at a frame rate between 6,000 frames per second and 1,000,000 frames per second while performing the three-point bend test on the first SENB test sample; and processing the captured images of the three-point bend test of the first SENB test sample to measure a length of a crack of the first SENB test sample and an opening size of the crack of the first SENB sample, the crack of the first SENB test sample having propagated through at least a portion of the first SENB test sample during the three-point bend test of the first SENB test sample.

23. The computer-implemented method of claim 22, wherein performing laboratory testing of the at least two SENB test samples comprises:

capturing images, by the camera, of the three-point bend test of the second SENB test sample at the frame rate between 6,000 frames per second and 1,000,000 frames per second while performing the three-point bend test on the second SENB test sample; and processing the captured images of the three-point bend test of the second SENB test sample to measure a length of a crack of the second SENB test sample and an opening size of the crack of the second SENB sample, the crack of the second SENB test sample having propagated through at least a portion of the second SENB test sample during the three-point bend test of the second SENB test sample.

\* \* \* \* \*